(12) United States Patent
Kim et al.

(10) Patent No.: US 12,727,336 B2
(45) Date of Patent: Sep. 1, 2026

(54) DISPLAY DEVICE AND METHOD OF PROVIDING THE SAME

(71) Applicant: Samsung Display Co., LTD., Yongin-si (KR)

(72) Inventors: Young Rok Kim, Yongin-si (KR); Kyu Soon Park, Yongin-si (KR); Jong Hyun Choung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 351 days.

(21) Appl. No.: 18/469,176

(22) Filed: Sep. 18, 2023

(65) Prior Publication Data

US 2024/0224605 A1 Jul. 4, 2024

(30) Foreign Application Priority Data

Dec. 30, 2022 (KR) ........................ 10-2022-0191193

(51) Int. Cl.

| | |
|---|---|
| ***H10K 59/122*** | (2023.01) |
| ***H10K 59/12*** | (2023.01) |
| ***H10K 59/131*** | (2023.01) |
| ***H10K 71/16*** | (2023.01) |
| ***H10K 71/20*** | (2023.01) |

(52) U.S. Cl.
CPC ....... *H10K 59/122* (2023.02); *H10K 59/1201* (2023.02); *H10K 59/131* (2023.02); *H10K 71/166* (2023.02); *H10K 71/231* (2023.02)

(58) Field of Classification Search
None
See application file for complete search history.

(56) References Cited

U.S. PATENT DOCUMENTS

| | | | |
|---|---|---|---|
| 7,291,970 B2 * | 11/2007 | Kuwabara ............ | H10K 59/122 313/506 |
| 9,054,058 B2 | 6/2015 | Sugisawa et al. | |
| 2005/0057151 A1 | 3/2005 | Kuwabara | |
| 2008/0023695 A1 * | 1/2008 | Cho ..................... | H10K 59/122 257/40 |
| 2021/0020733 A1 * | 1/2021 | Saida ..................... | H05B 33/22 |
| 2023/0200142 A1 * | 6/2023 | Go ....................... | H10K 59/878 257/91 |

FOREIGN PATENT DOCUMENTS

| | | |
|---|---|---|
| CN | 113471384 A | 10/2021 |
| CN | 113629115 A | 11/2021 |
| KR | 20130007971 A | 1/2013 |
| KR | 1020210086869 A | 7/2021 |

* cited by examiner

*Primary Examiner* — Thomas A Hollweg

(74) *Attorney, Agent, or Firm* — CANTOR COLBURN LLP

(57) ABSTRACT

A display device includes first and second emitting layers of first and second organic layers, on first and second pixel electrodes, in first and second emission areas, respectively, a first bank layer defining the first and second emission areas, a second bank layer on the first bank layer and defining protruding tips, a first pattern of the first organic layer which is on the second bank layer, an inorganic layer on the first emitting layer and the first pattern, a metal pattern on the inorganic layer to surround the second emission area, and a second pattern of the second organic layer which is on the metal pattern to surround the second emission area. The second pattern and the metal pattern form an undercut structure.

20 Claims, 36 Drawing Sheets

DISPLAY DEVICE AND METHOD OF PROVIDING THE SAME

This application claims priority to Korean Patent Application No. 10-2022-0191193, filed on Dec. 30, 2022, and all the benefits accruing therefrom under 35 U.S.C. § 119, the disclosure of which is incorporated herein in its entirety by reference.

BACKGROUND

1. Field

The present disclosure relates to a display device and a method of manufacturing (or providing) the same.

2. Description of the Related Art

As the information society develops, demands for display devices for displaying images are increasing in various forms. For example, display devices are applied to various electronic devices such as smartphones, digital cameras, notebook computers, navigation devices, and smart televisions. The display devices may be flat panel display devices such as liquid crystal display devices, field emission display devices, and organic light emitting display devices. Among these flat panel display devices, a light emitting display device includes a light emitting element that enables each pixel of a display panel to emit light by itself. Thus, the light emitting display device can display an image without a backlight unit that provides light to the display panel.

SUMMARY

Aspects of the present disclosure provide a display device in which exposure of an organic material to a chemical solution used in a strip process can be avoided, and in which peeling of layers on the organic material can be prevented in a process of forming (or providing) separate light emitting elements respectively in a plurality of emission areas without a mask process, and a method of manufacturing (or providing) the display device.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a display device includes a first pixel electrode disposed on a substrate in a first emission area, a first light emitting layer disposed on the first pixel electrode, a second pixel electrode disposed on the substrate in a second emission area, a second light emitting layer disposed on the second pixel electrode, a first bank surrounding the first and second emission areas, a second bank disposed on the first bank and including tips protruding further than the first bank, a first organic pattern disposed on the second bank and including the same material as the first light emitting layer, a first inorganic layer disposed on the first light emitting layer and the first organic pattern, a metal pattern disposed on the first inorganic layer to surround the second emission area, and a second organic pattern disposed on the metal pattern to surround the second emission area and including the same material as the second light emitting layer. An undercut structure in which side surfaces of the metal pattern are recessed inward from side surfaces of the second organic pattern is formed.

The metal pattern may include at least one of indium tin oxide (ITO), indium zinc oxide (IZO), indium tin zinc oxide (ITZO), indium gallium zinc oxide (IGZO), indium gallium oxide (IGO), indium tin gallium oxide (ITGO), and indium tin gallium zinc oxide (ITGZO).

The second organic pattern may cover side surfaces of the second bank, side surfaces of the first organic pattern, side surfaces of the first inorganic layer, and the side surfaces of the metal pattern which are adjacent to the second emission area.

The display device may further include a first common electrode disposed between the first light emitting layer and the first inorganic layer, and a second common electrode disposed on the second light emitting layer.

The first and second common electrodes may contact side surfaces of the first bank and may be electrically connected through the first bank.

The display device may further include a second inorganic layer disposed on the second light emitting layer and the second organic pattern.

The display device may further include a third pixel electrode disposed on the substrate in a third emission area, a third light emitting layer disposed on the third pixel electrode, and a third common electrode disposed on the third light emitting layer.

The metal pattern may be disposed on the first inorganic layer to surround the third emission area, and the second organic pattern may be disposed on the metal pattern to surround the third emission area.

The display device may further include a third organic pattern disposed on the second inorganic layer and including the same material as the third light emitting layer, and a third inorganic layer disposed on the third light emitting layer and the third organic pattern.

The third organic pattern may cover the side surfaces of the second bank, the side surfaces of the first organic pattern, the side surfaces of the first inorganic layer, the side surfaces of the metal pattern, the side surfaces of the second organic pattern, and side surfaces of the second inorganic layer which are adjacent the third emission area.

According to an embodiment, a method of manufacturing a display device includes forming first through third pixel electrodes on a substrate, sequentially stacking a sacrificial layer, an insulating layer, a first bank, and a second bank on the first through third pixel electrodes, exposing the first pixel electrode by etching the second bank, the first bank, the insulating layer, and the sacrificial layer, forming a first light emitting layer on the first pixel electrode and forming a first organic pattern on the second bank, forming a first inorganic layer on the first light emitting layer and the first organic pattern, forming a metal pattern on the first inorganic layer and patterning the metal pattern in an area overlapping the second pixel electrode, and exposing the second pixel electrode by etching the second bank, the first bank, the insulating layer, and the sacrificial layer using the metal pattern as a hard mask.

The metal pattern may include at least one of indium tin oxide (ITO), indium zinc oxide (IZO), indium tin zinc oxide (ITZO), indium gallium zinc oxide (IGZO), indium gallium oxide (IGO), indium tin gallium oxide (ITGO), and indium tin gallium zinc oxide (ITGZO).

The exposing of the first pixel electrode may include forming protruding tips of the second bank by etching side surfaces of the first bank more than side surfaces of the second bank.

The forming of the first light emitting layer and the first organic pattern may include letting an organic material deposited on the substrate be cut into the first light emitting layer and the first organic pattern by the tips of the second bank.

The method may further include forming a second light emitting layer on the second pixel electrode and forming a second organic pattern on the metal pattern, forming a second inorganic layer on the second light emitting layer and the second organic pattern, and sequentially stacking first through third metal masks on the second inorganic layer and patterning the first through third metal masks in an area overlapping the third pixel electrode.

The method may further include exposing the metal pattern by etching the second inorganic layer and the second organic pattern using the third metal mask as a hard mask, and etching the third metal mask and the metal pattern which include the same metal material.

The method may further include removing the second metal mask while etching the first inorganic layer, the first organic pattern, the second bank, and the first bank using the second metal mask as a hard mask, and removing the first metal mask while etching the insulating layer and the sacrificial layer using the first metal mask as a hard mask.

The method may further include forming a third light emitting layer on the third pixel electrode and forming a third organic pattern on the second inorganic layer, forming a third inorganic layer on the third light emitting layer and the third organic pattern, forming a fourth metal mask on the third inorganic layer to overlap the third pixel electrode, and etching the third inorganic layer and the third organic pattern using the fourth metal mask as a hard mask.

The method may further include forming a plurality of fifth metal masks on the fourth metal mask to overlap the third pixel electrode and on the second inorganic layer to overlap the second pixel electrode, and etching the second inorganic layer and the second organic pattern using the fifth metal masks as hard masks.

The method may further include etching the fifth metal masks and the metal pattern. The etching of the metal pattern may include letting the metal pattern remain in an area surrounding each of the second and third pixel electrodes.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
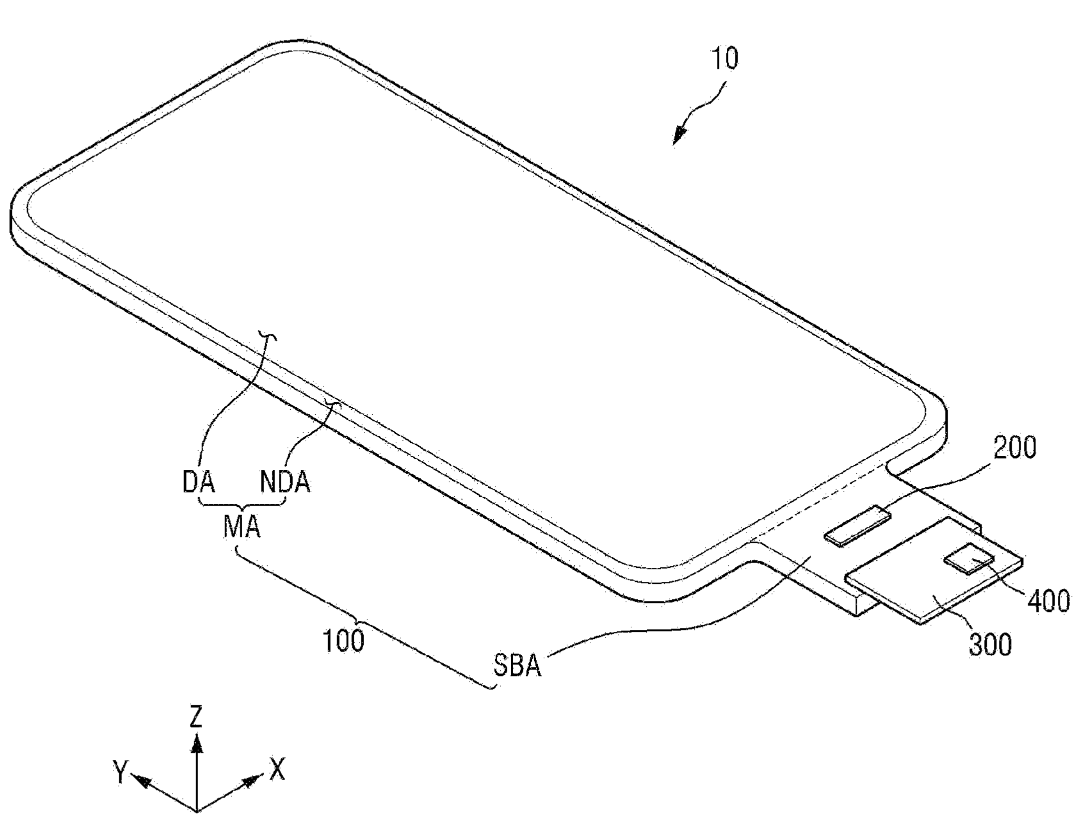
FIG. 1 is a perspective view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements. Within the Figures and the text of the disclosure, a reference number indicating a singular form of an element may also be used to reference a plurality of the singular element.

When an element, such as a layer, is referred to as being related to another element such as being "on," "connected to," or "coupled to" another element or layer, it may be directly on, connected to, or coupled to the other element or layer or intervening elements or layers may be present. When, however, an element or layer is referred to as being related to another element such as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another (e.g., crossing each other or intersecting each other).

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. For example, "about" can mean within one or more standard deviations, or within ±30%, 20%, 10% or 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the disclosure is described with reference to the accompanying drawings.

FIG. 1 is a perspective view of a display device 10 according to an embodiment.

Referring to FIG. 1, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). Alternatively, the display device 10 may be applied as a display unit of a television, a notebook computer, a monitor, a billboard, or an Internet of things (IoT) device. Alternatively, the display device 10 may be applied to wearable devices such as smart watches, watch phones, glass-like displays, and head-mounted displays (HMDs).

The display device 10 may have a planar shape in a quadrangle. For example, the display device 10 may have a planar shape of a quadrangle having short sides extending in an X-axis direction and long sides which extend in a Y-axis direction. Each corner where a short side extending in the X-axis direction meets a long side extending in the Y-axis direction may be rounded with a predetermined curvature or may be right-angled in a plan view (e.g., a view of a plane defined by the X-axis direction and the Y-axis direction crossing each other). The planar shape of the display device 10 is not limited to the quadrangular planar shape but may also be similar to other planar shapes such as polygonal shapes, a circular shape, or an oval shape.

The display device 10 may include a display panel 100, a display driver 200, a circuit board 300, and a touch driver 400.

The display panel 100 may include a main area MA and a sub-area SBA. Various elements or layers of the display device 10 may have a main area MA and a sub-area SBA corresponding to those described for the display panel 100, without being limited thereto.

The main area MA may include a display area DA including pixels SP as a display unit for displaying an image, and a non-display area NDA which is disposed adjacent to the display area DA. In an embodiment, the non-display area NDA may be around the display area DA in the plan view, such as to extend along one of, more than one of or all sides of the display area DA. The display area DA may emit light from a plurality of emission areas (e.g., a light emission area provided in plural) or a plurality of opening areas. For example, the display panel 100 may include a pixel circuit including switching elements, a pixel defining layer defining the emission areas or the opening areas, and a self-light emitting element. Each of the pixels SP may include the aforementioned elements of the pixel circuit, the pixel defining layer and the self-light emitting element connected which are variously connected to each other, without being limited thereto.

For example, the self-light emitting element as a light emitting element may include, but not limited to, at least one of an organic light emitting diode including an organic light emitting layer, a quantum dot light emitting diode including a quantum dot light emitting layer, an inorganic light emitting diode including an inorganic semiconductor, and a micro light emitting diode.

The non-display area NDA may be an area (e.g., a planar area along a plane) outside the display area DA. The non-display area NDA may be defined as an edge area of the main area MA of the display panel 100. The non-display area NDA may include a gate driver (not illustrated) which supplies gate signals to gate lines GL, and fan-out lines FOL which connect the display driver 200 and the display area DA to each other.

Figure 2:
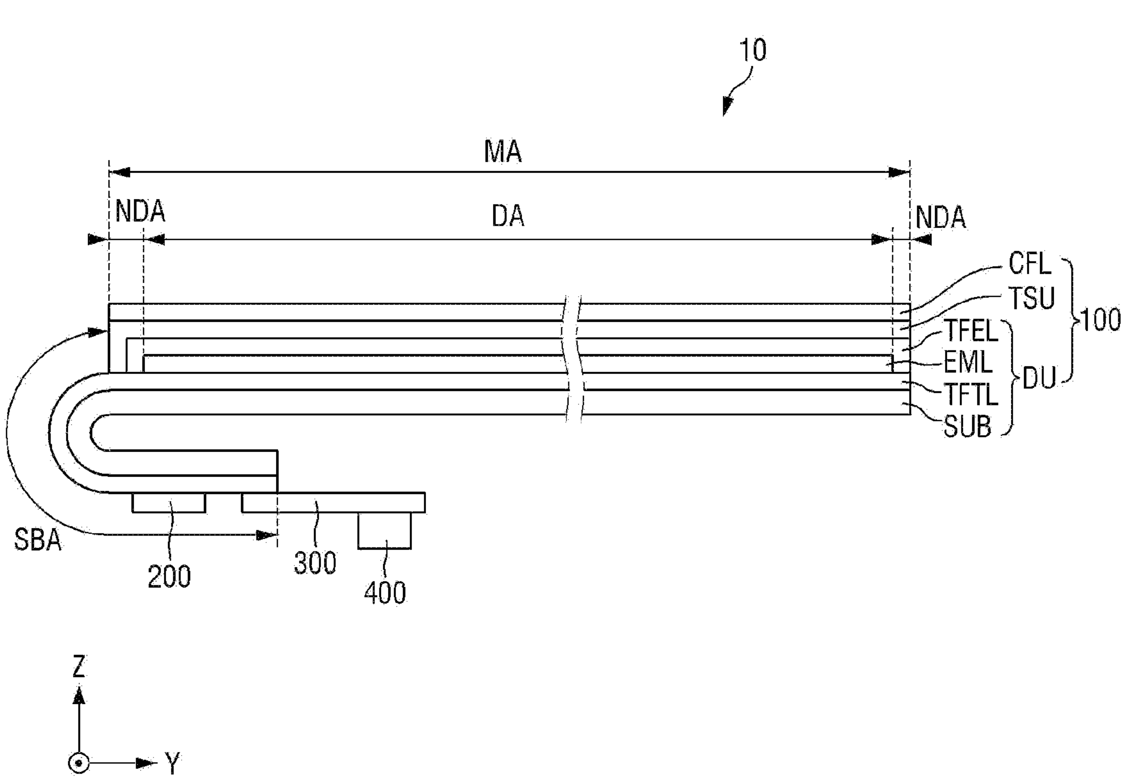
FIG. 2 is a cross-sectional view of the display device according to the embodiment.

The sub-area SBA may extend from a side of the main area MA. The sub-area SBA may include a flexible material that can be bent, folded, rolled, etc. For example, when the sub-area SBA is bent, it may be overlapped by the main area MA in a thickness direction (Z-axis direction). Referring to FIG. 2, for example, the display device 10 which is bent or folded may dispose the sub-area SBA overlapping the main area MA along the thickness direction. The sub-area SBA may include the display driver 200 and a pad unit connected to the circuit board 30). Optionally, the sub-area SBA may be omitted, and the display driver 200 and the pad unit may be disposed in the non-display area NDA.

The display driver 200 may output signals and voltages as electrical signals for driving the display panel 100. The display driver 200 may supply data voltages to data lines DL. The display driver 200 may supply a power supply voltage to a power line VL and supply a gate control signal to the gate driver. The display driver 200 may be formed or provided as an integrated circuit and mounted on the display panel 100 by a chip on glass (COG) method, a chip on plastic (COP) method, or an ultrasonic bonding method. For example, the display driver 200 may be disposed in the sub-area SBA and may be overlapped by the main area MA in the thickness direction (Z-axis direction) by the bending of the display panel 100 at the sub-area SBA. For another example, the display driver 200 may be mounted on the circuit board 300.

The circuit board 300 may be attached onto the pad unit of the display panel 100 using an anisotropic conductive film. That is, the circuit board 300 may be connected to the display panel 100 at the pad unit thereof. Lead lines of the circuit board 300 may be electrically connected to the display panel 100 at the pad unit. The circuit board 300 may be a flexible printed circuit board, a printed circuit board, or a flexible film such as a chip on film.

The touch driver 400 may be mounted on the circuit board 300. The touch driver 400 may be connected to a touch sensing unit of the display panel 100. The touch driver 400 may supply a driving signal to a plurality of touch electrodes of the touch sensing unit and sense a change in capacitance between the touch electrodes. For example, an electrical signal such as the driving signal may be a pulse signal having a predetermined frequency. The touch driver 400 may calculate whether an input has been made to the display device 10 and coordinates of the input based on a change in capacitance between the touch electrodes. The touch driver 400 may be formed as an integrated circuit.

FIG. 2 is a cross-sectional view of the display device 10 according to the embodiment. FIG. 2 shows the display device 10 (and the display panel 100) which is bent or folded at the sub-area SBA.

Referring to FIG. 2, the display panel 100 may include a display unit DU (e.g., an image-displaying structure), a touch sensing unit TSU (e.g., a touch sensor), and a color filter layer CFL. The display unit DU may include a substrate SUB, a thin-film transistor layer TFTL, a light emitting element layer EML, and an encapsulation layer TFEL.

The substrate SUB may be a base substrate or a base member. The substrate SUB may be a flexible substrate that can be bent, folded, rolled, etc. (e.g., is bendable, foldable, rollable, etc.) For example, the substrate SUB may include polymer resin such as polyimide (PI), but the present disclosure is not limited thereto. For another example, the substrate SUB may include a glass material or a metal material.

The thin-film transistor layer TFTL may be disposed on the substrate SUB. The thin-film transistor layer TFTL may include a plurality of thin-film transistors TFT constituting pixel circuits of pixels SP. The thin-film transistor layer TFTL may further include gate lines GL, data lines DL, power lines VL, gate control lines GCL, fan-out lines FOL connecting the display driver 200 and the data lines DL, and lead lines connecting the display driver 200 and the pad unit. Each of the thin-film transistors TFT may include a semiconductor region ACT, a source electrode SE, a drain electrode DE, and a gate electrode GE. For example, when the gate driver is formed on a side of the non-display area NDA of the display panel 100, the gate driver may include thin-film transistors TFT.

The thin-film transistor layer TFTL may be disposed in the display area DA, the non-display area NDA, and the sub-area SBA. The thin-film transistors TFT of the pixels SP, the gate lines GL, the data lines DL, and the power lines VL of the thin-film transistor layer TFTL may be disposed in the display area DA. The gate control lines GCL and the fan-out lines FOL of the thin-film transistor layer TFTL may be disposed in the non-display area NDA. The lead lines of the thin-film transistor layer TFTL may be disposed in the sub-area SBA.

The light emitting element layer EML may be disposed on the thin-film transistor layer TFTL. The light emitting element layer EML may include a plurality of light emitting elements, each including a pixel electrode, a light emitting layer and a common electrode sequentially stacked to emit light, and a pixel defining layer defining the pixels SP. The light emitting elements of the light emitting element layer EML may be disposed in the display area DA. That is, the light emitting element layer EML may face the thin-film transistor layer TFTL, at the display area DA. Referring to FIG. 2, for example, the thin-film transistor layer TFTL and/or the substrate SUB may extend further than an end of the light emitting element layer EML, without being limited thereto.

For example, the light emitting layer may be an organic light emitting layer including an organic material. The light emitting layer may include a hole transporting layer, an organic light emitting layer, and an electron transporting layer. When the pixel electrode receives a predetermined voltage through a thin-film transistor of the thin-film transistor layer TFTL and the common electrode receives a cathode voltage, holes and electrons may move to the organic light emitting layer through the hole transporting layer and the electron transporting layer, respectively, and may combine together in the organic light emitting layer to emit light. For example, the pixel electrode may be an anode, and the common electrode may be a cathode, but the present disclosure is not limited thereto.

Alternatively, the light emitting elements may include a quantum dot light emitting diode including a quantum dot light emitting layer, an inorganic light emitting diode including an inorganic semiconductor, or a micro light emitting diode.

The encapsulation layer TFEL may cover upper and side surfaces of the light emitting element layer EML and may protect the light emitting element layer EML. The encapsulation layer TFEL may be disposed facing the thin-film transistor layer TFTL and/or the substrate SUB, with the light emitting element layer EML therebetween. The encapsulation layer TFEL may include at least one inorganic layer and at least one organic layer to encapsulate the light emitting element layer EML.

The touch sensing unit TSU may be disposed on the encapsulation layer TFEL. The touch sensing unit TSU may include a plurality of touch electrodes for sensing an external input such as a user's touch in a capacitive manner, and touch lines connecting the touch electrodes and the touch driver 400 to each other. For example, the touch sensing unit TSU may sense the external input in a mutual capacitance manner or a self-capacitance manner.

Alternatively, the touch sensing unit TSU may be disposed on a separate substrate disposed on and outside of the display unit DU. In this case, the substrate supporting the touch sensing unit TSU may be a base member that functions to encapsulate the display unit DU.

The touch electrodes of the touch sensing unit TSU may be disposed in a touch sensor area overlapping (or corresponding to) the display area DA. The touch lines of the touch sensing unit TSU may be disposed in a touch peripheral area overlapping (or corresponding to) the non-display area NDA.

The color filter layer CFL may be disposed on the touch sensing unit TSU. The color filter layer CFL may include a plurality of color filters corresponding to a plurality of emission areas, respectively. Each of the color filters may selectively transmit light of a specific wavelength and block or absorb light of other wavelengths. The color filter layer CFL may absorb a part of light coming from the outside of the display device 10, thereby reducing reflected light due to the external light. Therefore, the color filter layer CFL may prevent color distortion due to reflection of external light.

Since the color filter layer CFL is directly disposed on the encapsulation layer TFEL, the display device 10 may not require a separate substrate for the color filter layer CFL. Therefore, an overall thickness of the display device 10 can be relatively reduced. As being directly disposed, elements may contact each other and/or form an interface therebetween.

The sub-area SBA of the display panel 100 may extend from a side of the main area MA. The sub-area SBA may include a flexible material that can be bent, folded, rolled, etc. For example, when the sub-area SBA is bent, it may be overlapped by the main area MA in the thickness direction (Z-axis direction). The sub-area SBA may include the display driver 200 and the pad unit each electrically connected to the circuit board 300.

Figure 3:
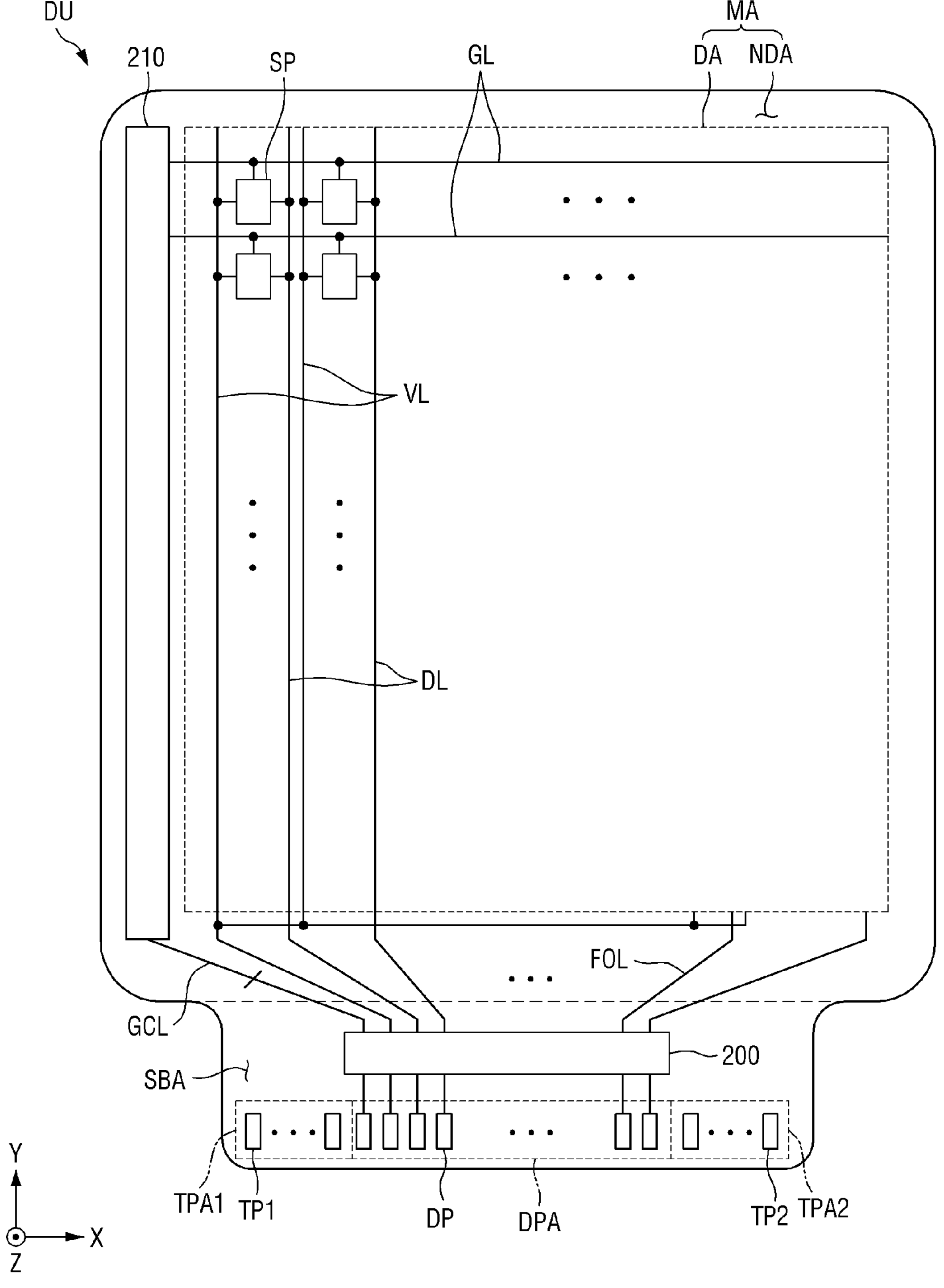
FIG. 3 is a plan view of a display unit of the display device according to the embodiment.

FIG. 3 is a plan view of the display unit DU of the display device 10 according to the embodiment. FIG. 3 may show the display unit DU which is unbent, unfolded, unrolled, etc.

Referring to FIG. 3, the display unit DU may include the display area DA and the non-display area NDA adjacent to each other.

The display area DA is an area (e.g., a planar area) for displaying an image and may be defined as a central area of the display panel 100. The display area DA may include a plurality of pixels SP, a plurality of gate lines GL, a plurality of data lines DL, and a plurality of power lines VL. Each of the pixels SP may be defined as a minimum unit (e.g., a display unit) that generates and/or outputs light.

The gate lines GL may supply gate signals received from a gate driver 210, to the pixels SP. The gate lines GL may extend in the X-axis direction and may be spaced apart from each other in the Y-axis direction intersecting the X-axis direction. A direction in which an element extends may be defined by a major dimension of such element, without being limited thereto.

The data lines DL may supply data voltages received from the display driver 200, to the pixels SP. The data lines DL may extend in the Y-axis direction and may be spaced apart from each other in the X-axis direction.

The power lines VL may supply a power supply voltage received from the display driver 200, to the pixels SP. Here, the power supply voltage may be at least one of a driving voltage, an initialization voltage, a reference voltage, and a low-potential voltage. The power lines VL may extend in the Y-axis direction and may be spaced apart from each other in the X-axis direction.

In an embodiment, the non-display area NDA may surround the display area DA, without being limited thereto. The non-display area NDA may include the gate driver 210, fan-out lines FOL, and gate control lines GCL. The gate driver 210 may generate a plurality of gate signals based on a gate control signal and sequentially supply the gate signals to the gate lines GL according to a set order.

The fan-out lines FOL may extend from the display driver 200 to the display area DA, and be respectively connected thereto. The fan-out lines FOL may supply the data voltages received from the display driver 200, to the data lines DL.

The gate control lines GCL may extend from the display driver 200 to the gate driver 210, and be respectively connected thereto. The gate control lines GCL may supply the gate control signal received from the display driver 200, to the gate driver 210.

The sub-area SBA may include the display driver 200, a display pad area DPA, and first and second touch pad areas TPA1 and TPA2.

The display driver 200 may output signals and voltages for driving the display panel 100, to the fan-out lines FOL. The display driver 200 may supply the data voltages to the data lines DL, through the fan-out lines FOL. The data voltages may be supplied to the pixels SP and may determine luminances of the pixels SP. The display driver 200 may supply the gate control signal to the gate driver 210, through the gate control lines GCL.

A display pad area DPA, a first touch pad area TPA1, and a second touch pad area TPA2 may be disposed at an edge of the display unit DU, at the sub-area SBA. The display pad area DPA, the first touch pad area TPA1, and the second touch pad area TPA2 may be electrically connected to the circuit board 300 which is an external element relative to the display unit DU, using a low-resistance high-reliability material such as an anisotropic conductive film or self-assembly anisotropic conductive paste (SAP).

The display pad area DPA may include a plurality of display pad units DP. (e.g., a display pad provided in plural including a plurality of display pads) The display pad units DP may be electrically connected to a graphics system, through the circuit board 3M). The display pad units DP may be connected to the circuit board 300 to receive digital video data and may supply the digital video data to the display driver 200.

The first touch pad area TPA1 may be disposed on a side of the display pad area DPA and may include a plurality of first touch pad units TP1 (e.g., a first touch pad provided in plural including a plurality of first touch pads). The first touch pad units TP1 may be electrically connected to the touch driver 400 disposed on the circuit board 300. That is, the first touch pad units TP1 may be connected to the touch driver 400 via elements of the circuit board 300. The first touch pad units TP1 may supply driving signals to a plurality of driving electrodes through a plurality of driving lines.

The second touch pad area TPA2 may be disposed on the other side of the display pad area DPA and may include a plurality of second touch pad units TP2 (e.g., a second touch pad provided in plural including a plurality of second touch pads). The second touch pad units TP2 may be electrically connected to the touch driver 400 disposed on the circuit board 300. The touch driver 400 may receive touch sensing signals through a plurality of sensing lines connected to the second touch pad units TP2 and sense a change in mutual capacitance between the driving electrodes and sensing electrodes.

Figure 4:
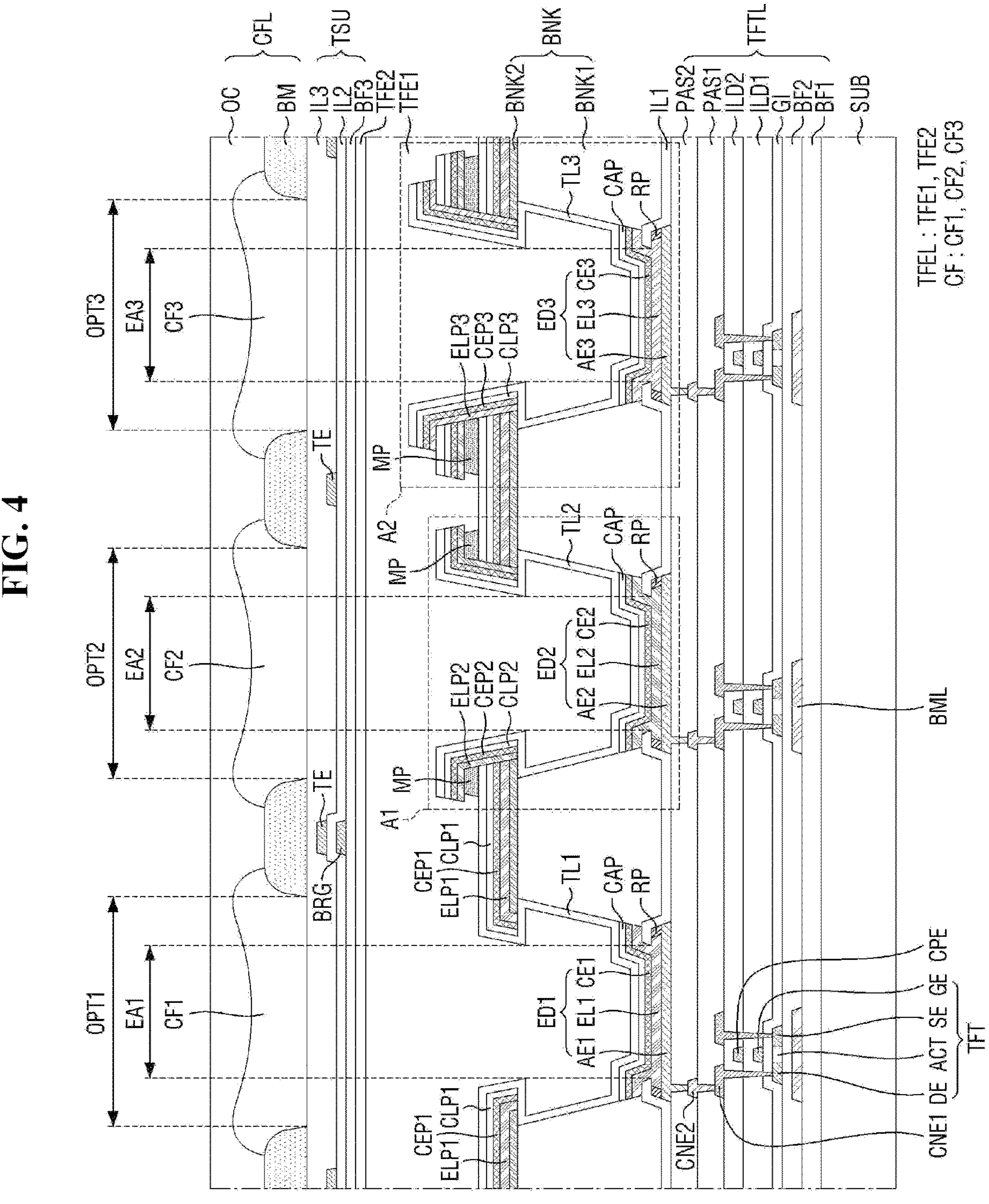
FIG. 4 is a cross-sectional view of a portion of the display device according to the embodiment.
Figure 5:
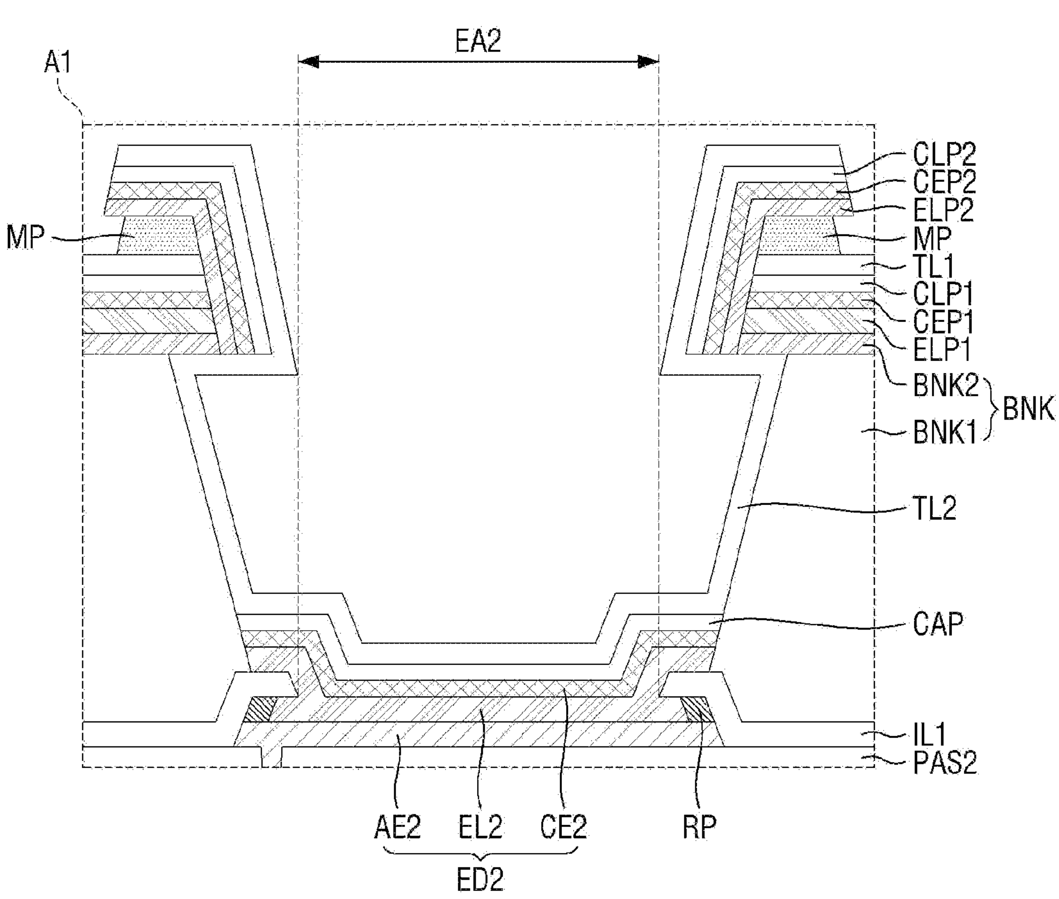
FIG. 5 is an enlarged cross-sectional view of area A1 of FIG. 4.
Figure 6:
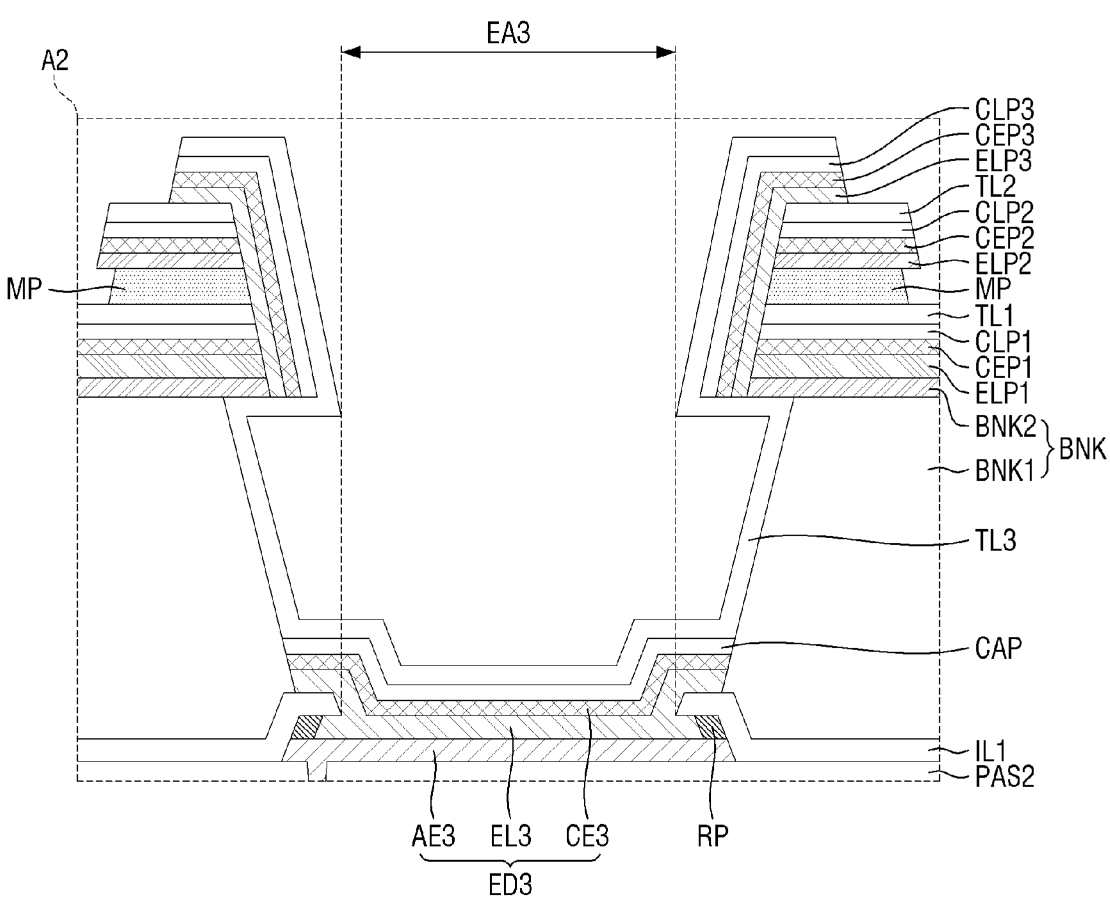
FIG. 6 is an enlarged cross-sectional view of area A2 of FIG. 4.

FIG. 4 is a cross-sectional view of a portion of the display device 10 according to the embodiment. FIG. 5 is an enlarged view of area A1 of FIG. 4. FIG. 6 is an enlarged view of area A2 of FIG. 4.

Referring to FIGS. 4 through 6, the display panel 100 may include the display unit DU, the touch sensing unit TSU, and the color filter layer CFL. The display unit DU may include the substrate SUB, the thin-film transistor layer TFTL, the light emitting element layer EML, and the encapsulation layer TFEL.

The substrate SUB may be a base substrate or a base member. The substrate SUB may be a flexible substrate that can be bent, folded, rolled, etc. For example, the substrate SUB may include polymer resin such as polyimide (PI), but the present disclosure is not limited thereto. For another example, the substrate SUB may include a glass material or a metal material.

The thin-film transistor layer TFTL may include a first buffer layer BF1, light blocking layers BML as a light blocking pattern provided in plural, a second buffer layer BF2, thin-film transistors TFT, a gate insulating layer GI, a first interlayer insulating film ILD1, capacitor electrodes CPE as a capacitor electrode or capacitor electrode pattern provided in plural, a second interlayer insulating film ILD2, first connection electrodes CNE1 as a first connection electrode CNE1 provided in plural, a first passivation layer PAS1, second connection electrodes CNE2 as a second connection electrode CNE2 provided in plural, and a second passivation layer PAS2.

The first buffer layer BF1 may be disposed on the substrate SUB. The first buffer layer BF1 may include an inorganic layer that can prevent penetration of air or moisture. For example, the first buffer layer BF1 may include a plurality of inorganic layers stacked on each other.

The light blocking layers BML may be disposed on the first buffer layer BF1. For example, each of the light blocking layers BML may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same. For another example, each of the light blocking layers BML may be an organic layer including a black pigment.

The second buffer layer BF2 may be disposed on the first buffer layer BF1 and the light blocking layers BML. The second buffer layer BF2 may include an inorganic layer that can prevent penetration of air or moisture. For example, the second buffer layer BF2 may include a plurality of inorganic layers stacked alternately.

The thin-film transistors TFT may be disposed on the second buffer layer BF2 and may constitute respective pixel circuits of pixels SP. For example, each of the thin-film transistors TFT may be a driving transistor or a switching transistor of a pixel circuit. Each of the thin-film transistors TFT may include a semiconductor region ACT as an active region, a source electrode SE, a drain electrode DE, and a gate electrode GE. Each of the semiconductor region ACT and the various electrodes can be provided in plural within the thin-film transistor layer TFTL.

The semiconductor region ACT, the source electrode SE, and the drain electrode DE may be disposed on the second buffer layer BF2. The semiconductor region ACT, the source electrode SE, and the drain electrode DE may overlap a light blocking layer BML in (or along) the thickness direction. The semiconductor region ACT may be overlapped by the gate electrode GE in the thickness direction and may be insulated from the gate electrode GE by the gate insulating layer GI. The source electrode SE and the drain electrode DE may be formed (or provided) by providing areas of a semiconductor material layer with conductivity, such as to define conductive electrode regions at the source electrode SE and the drain electrode DE.

The gate electrode GE may be disposed on the gate insulating layer GI. The gate electrode GE may overlap the semiconductor region ACT with the gate insulating layer GI interposed between them.

The gate insulating layer GI may be disposed on the semiconductor regions ACT, the source electrodes SE, and the drain electrodes DE. For example, the gate insulating layer GI may cover the semiconductor regions ACT, the source electrodes SE, the drain electrodes DE and the second buffer layer BF2 and may insulate the semiconductor regions ACT from the gate electrodes GE. The gate insulating layer GI may include or define contact holes through which the first connection electrodes CNE1 respectively pass.

The first interlayer insulating film ILD1 may be disposed on the gate electrodes GE and the gate insulating layer GI. The first interlayer insulating film ILD1 may include or define contact holes through which the first connection electrodes CNE1 respectively pass. The contact holes of the first interlayer insulating film ILD1 may be connected to or aligned with the contact holes of the gate insulating layer GI and contact holes of the second interlayer insulating film ILD2.

The capacitor electrodes CPE may be disposed on the first interlayer insulating film ILD1. The capacitor electrodes CPE may overlap the gate electrodes GE in the thickness direction. The capacitor electrodes CPE and the gate electrodes GE may form capacitances therebetween.

The second interlayer insulating film ILD2 may be disposed on the capacitor electrodes CPE and on the first interlayer insulating film ILD1. The second interlayer insulating film ILD2 may include (or define) contact holes through which the first connection electrodes CNE1 respectively pass. The contact holes of the second interlayer insulating film ILD2 may be connected to or aligned with the contact holes of the first interlayer insulating film ILD1 and the contact holes of the gate insulating layer GI.

The first connection electrodes CNE1 may be disposed on the second interlayer insulating film ILD2. The first connection electrodes CNE1 may electrically connect the drain electrodes DE of the thin-film transistors TFT to the second connection electrodes CNE2. The first connection electrodes CNE1 may be inserted into or extend through the respective contact holes provided in the second interlayer insulating film ILD2, the first interlayer insulating film ILD1 and the gate insulating layer GI, to contact the drain electrodes DE of the thin-film transistors TFT and/or the second connection electrodes CNE2. As being in contact, elements may form an interface therebetween, without being limited thereto.

The first passivation layer PAS1 may be disposed on the first connection electrodes CNE1 and the second interlayer insulating film ILD2. The first passivation layer PAS1 may protect the thin-film transistors TFT. The first passivation layer PAS1 may include contact holes through which the second connection electrodes CNE2 respectively pass.

The second connection electrodes CNE2 may be disposed on the first passivation layer PAS1. A second connection electrodes CNE2 may electrically connect a first connection electrode CNE1 to a first pixel electrode AE1 of a first light emitting element ED1. The second connection electrodes CNE2 may be inserted into (or extend through) the contact holes provided in the first passivation layer PAS1, to contact the first connection electrodes CNE1.

The second passivation layer PAS2 may be disposed on the second connection electrodes CNE2 and the first passivation layer PAS1. The second passivation layer PAS2 may include a contact hole through which the first pixel electrode AE1 of the first light emitting element ED1 passes.

The light emitting element layer EML may be disposed on the thin-film transistor layer TFTL. The light emitting element layer EML may include first through third light emitting elements ED1 through ED3, residual patterns RP in a residual pattern layer, a first insulating layer IL1, capping layers CAP, a bank BNK of a bank layer, first through third organic patterns ELP1 through ELP3, first through third electrode patterns CEP1 through CEP3 in an electrode pattern layer, first through third capping patterns CLP1 through CLP3, first through third inorganic layers TL1 through TL3 as a plurality of inorganic patterns in an inorganic pattern layer, and a metal pattern MP provided in plural in a metal pattern layer.

The display device 10 may include a plurality of pixels SP arranged along a plurality of rows and a plurality of columns, in the display area DA. The pixels SP may respectively include first through third emission areas EA1 through EA3 (e.g., a first light emission area, a second light emission area and a third light emission area) defined by the bank BNK or the pixel defining layer, and may emit light having a predetermined wavelength at the first through third emission areas EA1 through EA3. Each of the first through third emission areas EA1 through EA3 may be an area (e.g., a planar area) where light generated by a light emitting element of the display device 10 is emitted to the outside of the display device 10. In FIG. 4, the banks BNK in order from left to right may respectively represent first to fourth bank portions. Where first through third emission areas EA1 through EA3 repeat along the substrate SUB, the leftmost and rightmost bank BNK may be left and right portions of a same one of the banks BNK, without being limited thereto.

Each of the first through third emission areas EA1 through EA3 may emit light having a predetermined peak wavelength, to the outside of the display device 10. The first emission area EA1 may emit light of a first color, the second emission area EA2 may emit light of a second color, and the third emission area EA3 may emit light of a third color. For example, the light of the first color may be red light having a peak wavelength of about 610 nanometers (nm) to about 650 nm, the light of the second color may be green light having a peak wavelength of about 510 nm to about 550 nm, and the light of the third color may be blue light having a peak wavelength of about 440 nm to about 480 nm. However, the present disclosure is not limited thereto.

For example, the area (e.g., a planar area) of the third emission area EA3 may be larger than the area of the first emission area EA1, and the area of the first emission area EA1 may be larger than the area of the second emission area EA2. However, the present disclosure is not limited thereto. For another example, among planar areas of the various light emission areas, the area of the first emission area EA1, the area of the second emission area EA2, and the area of the third emission area EA3 may be substantially the same.

The first light emitting element ED1 may be disposed on the thin-film transistor layer TFTL, in the first emission area EA1. The first light emitting element ED1 may include the first pixel electrode AE1, a first light emitting layer EL1, and a first common electrode CE1. The second light emitting element ED2 may be disposed on the thin-film transistor layer TFTL in the second emission area EA2. The second light emitting element ED2 may include a second pixel electrode AE2, a second light emitting layer EL2, and a second common electrode CE2. The third light emitting element ED3 may be disposed on the thin-film transistor layer TFTL in the third emission area EA3. The third light emitting element ED3 may include a third pixel electrode AE3, a third light emitting layer EL3, and a third common electrode CE3.

The first through third pixel electrodes AE1 through AE3 may be disposed on the second passivation layer PAS2. Each of the first through third pixel electrodes AE1 through AE3 may be electrically connected to the drain electrode DE of a thin-film transistor TFT, through the first and second connection electrodes CNE1 and CNE2. The first through third pixel electrodes AE1 through AE3 may be insulated from each other by the first insulating layer IL1. The first through third pixel electrodes AE1 through AE3 may be spaced apart from each other by a gap between pixel electrodes adjacent to each other, in a direction along the thin-film transistor layer TFTL. Portions of the first insulating layer IL1 may be between the pixel electrodes adjacent to teach other.

For example, the first through third pixel electrodes AE1 through AE3 may include at least one of silver (Ag), copper (Cu), aluminum (Al), nickel (Ni), and lanthanum (La). For another example, the first through third pixel electrodes AE1 through AE3 may include a material such as indium tin oxide (ITO), indium zinc oxide (IZO), or indium tin zinc oxide (ITZO). For another example, the first through third pixel electrodes AE1 through AE3 may have a stacked structure of ITO/Ag/ITO, ITO/Ag/IZO, or ITO/Ag/ITZO/IZO.

The first insulating layer IL1 may be disposed on the second passivation layer PAS2 and on the residual patterns RP. The first insulating layer IL1 may cover edges of the first through third pixel electrodes AE1 through AE3 and edges of the residual patterns RP, and may partially expose upper surfaces of the first through third pixel electrodes AE1 through AE3 to outside the first insulating layer IL1. For example, the first insulating layer IL1 may expose the first pixel electrode AE1 in the first emission area EA1 to define an exposed portion of the first pixel electrode AE1, and the first light emitting layer EL1 may be directly disposed on the exposed portion of the first pixel electrode AE1. The first insulating layer IL1 may include an inorganic insulating material. The first insulating layer IL1 may include, but not limited to, at least one of a silicon nitride layer, a silicon oxynitride layer, a silicon oxide layer, a titanium oxide layer, an aluminum oxide layer, and an amorphous silicon layer.

A residual pattern RP may be disposed on the edges of each of the first through third pixel electrodes AE1 through AE3. The first insulating layer IL1 may not directly contact the upper surface of each of the first through third pixel electrodes AE1 through AE3 at the edges thereof, due to the residual pattern RP. The residual pattern RP may be formed as a result of removing a sacrificial layer SFL (see FIG. 7) disposed on each of the first through third pixel electrodes AE1 through AE3 in a process of manufacturing or providing the display device 10.

The first through third light emitting layers EL1 through EL3 may be organic light emitting layers made of or including an organic material, and may be formed or provided on the first through third pixel electrodes AE1 through AE3 through a deposition process. For example, an organic material may be deposited in a direction inclined from an upper surface of the substrate SUB in a deposition process of the first through third light emitting layers EL1 through EL3.

The first light emitting layer EL1 may be directly disposed on the exposed portion of the first pixel electrode AE1 in the first emission area EA1. A first portion of the first light emitting layer EL1 may fill a space or recess defined by (e.g., surrounded by) the first pixel electrode AE1 together with the residual pattern RP and the first insulating layer IL1, and the other portion of the first light emitting layer EL1 (e.g., a remaining portion) may extend from the recess (e.g., out of the recess) to cover a portion of an upper surface of the first insulating layer IL1. The second light emitting layer EL2 may be directly disposed on an exposed portion of the second pixel electrode AE2 in the second emission area EA2. A portion of the second light emitting layer EL2 may fill a space surrounded by the second pixel electrode AE2, the residual patterns RP and the first insulating layer IL1, and the other portion of the second light emitting layer EL2 may cover a portion of the upper surface of the first insulating layer IL1. The third light emitting layer EL3 may be directly disposed on an exposed portion of the third pixel electrode AE3 in the third emission area EA3. A portion of the third light emitting layer EL3 may fill a space surrounded by the third pixel electrode AE3, the residual pattern RP and the first insulating layer IL1, and the other portion of the third light emitting layer EL3 may cover a portion of the upper surface of the first insulating layer IL1.

For example, when a thin-film transistor TFT applies a predetermined voltage to the first pixel electrode AE1 of the first light emitting element ED1 and the first common electrode CE1 of the first light emitting element ED1 receives a common voltage or a cathode voltage, holes and electrons may move to the first light emitting layer EL1 through a hole transporting layer and an electron transporting layer of the first light emitting layer EL1, respectively, and may combine together in the first light emitting layer EL1 to emit light.

The first common electrode CE1 may be disposed on the first light emitting layer EL1, the second common electrode CE2 may be disposed on the second light emitting layer EL2, and the third common electrode CE3 may be disposed on the third light emitting layer EL3. The first through third common electrodes CE1 through CE3 as a plurality of common electrode patterns may include a transparent conductive material and transmit light generated from the first through third light emitting layers EL1 through EL3. The first through third common electrodes CE1 through CE3 may contact side surfaces of a first bank BNK1 and may be electrically connected to each other by the first bank BNK1. For example, the first common electrode CE1 may receive a common voltage or a low-potential voltage. When the first pixel electrode AE1 receives a voltage corresponding to a data voltage and the first common electrode CE1 receives a low-potential voltage, a potential difference may be formed between the first pixel electrode AE1 and the first common electrode CE1 so that the first light emitting layer EL1 can emit light.

The capping layers CAP as a plurality of capping layer patterns may be disposed on the first through third common electrodes CE1 through CE3, respectively. The capping layers CAP may include an inorganic insulating material and may cover the first through third light emitting elements ED1 through ED3. The capping layers CAP may prevent the first through third light emitting elements ED1 through ED3 from being damaged by external air. For example, each of the capping layers CAP may include, but not limited to, at least one of a silicon nitride layer, a silicon oxynitride layer, a silicon oxide layer, a titanium oxide layer, an aluminum oxide layer, and an amorphous silicon layer.

The bank BNK may be disposed on the first insulating layer IL1 to define the first through third emission areas EA1 through EA3. The bank BNK may surround the first through third emission areas EA1 through EA3 in the plan view. The bank BNK may include first and second banks BNK1 and BNK2, as a first bank layer and a second bank layer, respectively.

The first bank BNK1 may be disposed on the first insulating layer IL1, and the second bank BNK2 may be disposed on the first bank BNK1. The first bank BNK1 and the second bank BNK2 may be solid portions (e.g., solid material portions), and adjacent first banks BNK1 (or adjacent second banks BNK2) may be spaced apart from each other with a gap therebetween. The gap may correspond to a respective light emission area and may define a bank layer together with the solid material portions.

The second bank BNK2 may include tips protruding further from an edge or side of the first bank BNK1 and in a direction toward the first through third emission areas EA1 through EA3 to define protruding tips of the second bank BNK2. The side surfaces of the first bank BNK1 may be recessed inward from side surfaces of the second bank BNK2. Accordingly, an undercut structure may be formed under the tips of the second bank BNK2, relative to the first bank BNK1. A thickness of the first bank BNK1 may be greater than that of the second bank BNK2.

The first and second banks BNK1 and BNK2 as a plurality of conductive banks may include different metal materials from each other, and etching rates of the first and second banks BNK1 and BNK2 may be different from each other. For example, the etching rate of the first bank BNK1 may be higher than that of the second bank BNK2, and the first bank BNK1 may be etched more than the second bank BNK2 in the process of forming the first through third emission areas EA1 through EA3. Therefore, the lateral shapes of the first and second banks BNK1 and BNK2 which together form a bank BNK may be determined by a difference in etching rate between the first and second banks BNK1 and BNK2. The first bank BNK1 may include a metal material having high electrical conductivity, and the second bank BNK2 may include a material having low reflectivity. For example, the first bank BNK1 may include aluminum (Al), and the second bank BNK2 may include titanium (Ti). However, the present disclosure is not limited thereto.

The bank layer including the bank BNK provided in plural spaced apart from each other along the thin-film transistor layer TFTL may include (or define) openings of the bank layer that form the first through third emission areas EA1 through EA3. The solid portions of the bank layer may be overlapped by a light blocking member BM of the color filter layer CFL. The first bank BNK1 may electrically connect the first through third common electrodes CE1 through CE3 spaced apart from each other, to each other. The second bank BNK2 may include a material having low reflectivity to reduce reflection of external light.

The bank layer including the bank BNK provided in plural may form the first through third emission areas EA1 through EA3 through a mask process, and the first through third light emitting layers EL1 through EL3 may be formed in openings of the bank layer which respectively correspond to the first through third emission areas EA1 through EA3, respectively. When a mask process is performed, a structure for mounting a mask may be required, and an excessively wide non-display area NDA may be required to control distribution of the mask process. Therefore, if the mask process is minimized, a structure for mounting the mask can be omitted, and the planar area of the non-display area NDA for distribution control can be minimized.

The first through third light emitting elements ED1 through ED3 may be formed through deposition and etching processes rather than a mask process. Since the bank BNK includes the first and second banks BNK1 and BNK2 together with each other and including different metal materials from each other, inner walls of the bank BNK which define the opening of the bank layer may have a tip structure including the undercut described above.

In the display device 10, different layers may be individually formed in the first through third emission areas EA1 through EA3 through a deposition process. For example, the first light emitting layer EL1 and the first organic pattern ELP1 may be deposited or provided using the same organic material of a same material layer, in a deposition process performed without a mask and may be cut and separated by the tips formed on the inner walls of the bank BNK. The first light emitting layer EL1 may be disposed in the first emission area EA1, and the first organic pattern ELP1 may be disposed on the bank BNK between the first through third emission areas EA1 through EA3.

A first organic material layer for forming the first light emitting layer EL1 may be deposited on the entire surface of the display device 10, and portions of the organic material layer of the first light emitting layer EL1 deposited in the second and third emission areas EA2 and EA3 may be removed. A second organic material layer for forming the second light emitting layer EL2 may be deposited on the entire surface of the display device 10, and the organic material layer of the second light emitting layer EL2 deposited in the first and third emission areas EA1 and EA3 may be removed. A third organic material for forming the third light emitting layer EL3 may be deposited on the entire surface of the display device 10, and the organic material layer of the third light emitting layer EL3 deposited in the first and second emission areas EA1 and EA2 may be removed.

Therefore, in the display device 10, different organic materials as defining respective material layers can be formed in the first through third emission areas EA1 through EA3 through deposition and etching processes without a mask process. Through the omission of an unnecessary process, the display device 10 can reduce manufacturing costs and minimize the area of the non-display area NDA.

The first organic pattern ELP1 may include the same organic material as the first light emitting layer EL1 and may be disposed on the second bank BNK2. The first organic pattern ELP1 may cover the side surfaces of the second bank BNK2 adjacent to the first emission area EA1. The first light emitting layer EL1 and the first organic pattern ELP1 may be deposited in the same process and may be cut and separated by the tips formed on the inner walls of the bank BNK. Therefore, the first organic pattern ELP1 may be disposed on the second bank BNK2 in planar areas other than the planar areas of the first through third emission areas EA1 through EA3. Here, the first light emitting layer EL1 and the first organic pattern ELP1 may be in a same layer as a plurality of organic patterns in a first organic pattern layer. As being in a same layer, elements may be formed in a same process and/or include a same material as each other, elements may be respective portions or patterns of a same material layer, elements may be on a same layer by forming an interface with a same underlying or overlying layer, etc., without being limited thereto.

The first electrode pattern CEP1 may include the same metal material as the first common electrode CE1 and may be disposed on the first organic pattern ELP1. Here, the first electrode pattern CEP1 and the first common electrode CE1 may be in a same layer. The first electrode pattern CEP1 may cover side surfaces of the first organic pattern ELP1 adjacent to the first emission area EA1. The first common electrode CE1 and the first electrode pattern CEP1 may be deposited in the same process, but may be cut by the tips formed on the inner walls of the bank BNK. Therefore, the first electrode pattern CEP1 may be disposed on the first organic pattern ELP1 in the areas other than the first through third emission areas EA1 through EA3.

The first capping pattern CLP1 may include the same inorganic material as the capping layer CAP and may be disposed on the first electrode pattern CEP1. Here, the first capping pattern CLP1 and the capping layer CAP may be in a same layer. The first capping pattern CLP1 may cover side surfaces of the first electrode pattern CEP1 adjacent to the first emission area EA1. The capping layer CAP and the first capping pattern CLP1 may be deposited in the same process, but may be cut by the tips formed on the inner walls of the bank BNK. Therefore, the first capping pattern CLP1 may be disposed on the first electrode pattern CEP1 in the areas other than the first through third emission areas EA1 through EA3.

The first inorganic layer TL1 may be disposed on the capping layer CAP of the first emission area EA1 and the first capping pattern CLP1. The first inorganic layer TL1 may cover the side surfaces of the first bank BNK1 surrounding the first emission area EA1. The first inorganic layer TL1 may include an inorganic material to prevent oxygen or moisture from penetrating into the first light emitting element ED1. The first inorganic layer TL1 may be an inorganic encapsulation layer. For example, the first inorganic layer TL1 may include, but not limited to, at least one of a silicon nitride layer, a silicon oxynitride layer, a silicon oxide layer, a titanium oxide layer, an aluminum oxide layer, and an amorphous silicon layer.

The metal pattern MP may be disposed on some areas of the first inorganic layer TL1. The metal pattern MP may surround each of the second and third emission areas EA2 and EA3 in a plan view. Side surfaces of the metal pattern MP may be recessed inward from side surfaces of the second organic pattern ELP2. The metal pattern MP may have an undercut structure in which it is etched more than the second organic pattern ELP2 disposed on the metal pattern MP. The metal pattern MP and the second organic pattern ELP2 may each include first side surfaces which are furthest from the second light emission area (e.g., the second emission area EA2), and the first side surfaces of the metal pattern MP form an undercut structure with the first side surfaces of the second organic pattern ELP2.

The metal pattern MP may serve as a mask in the process of forming the second emission area EA2. For example, when the second emission area EA2 is formed using a photoresist as a mask, the photoresist may be removed through a strip process after the second emission area EA2 is formed. If there is an exposed organic layer in the strip process of the photoresist, a chemical solution used in the strip process may penetrate into the organic layer to melt the organic layer, and layers disposed on the organic layer may be lifted. The metal pattern MP may include at least one of indium tin oxide (ITO), indium zinc oxide (IZO), indium tin zinc oxide (ITZO), indium gallium zinc oxide (IGZO), indium gallium oxide (IGO), indium tin gallium oxide (ITGO), and indium tin gallium zinc oxide (ITGZO). For example, the metal pattern MP may include indium tin oxide (ITO) to serve as a hard mask in the process of forming the second emission area EA2.

Therefore, since the second emission area EA2 is formed using the metal pattern MP in the display device 10, the exposure of the first organic pattern ELP1 in the photoresist strip process can be avoided, and the peeling of the first electrode pattern CEP1, the first capping pattern CLP1 and the first inorganic layer TL1 on the first organic pattern ELP1 can be prevented.

The second organic pattern ELP2 may include the same organic material as the second light emitting layer EL2 and may be disposed on the metal pattern MP. Here, the second organic pattern ELP2 and the second light emitting layer EL2 may be in a same layer as a plurality of organic patterns in a second organic pattern layer. The second organic pattern ELP2 may cover the side surfaces of the second bank BNK2, the first organic pattern ELP1, the first electrode pattern CEP1, the first capping pattern CLP1, the first inorganic layer TL1, and the metal pattern MP which are adjacent to the second emission area EA2. In an embodiment, each of the second bank layer (e.g., the second bank BNK2), the first organic pattern ELP1, the first inorganic layer TL1 and the metal pattern MP includes second side surfaces closest to the second emission area EA2, and the second organic pattern ELP2 covers the second side surfaces of the second bank layer, the second side surfaces of the first organic pattern ELP1, the second side surfaces of the first inorganic layer TL1, and the second side surfaces of the metal pattern MP.

The second light emitting layer EL2 and the second organic pattern ELP2 may be deposited in the same process, but may be cut by the tips formed on the inner walls of the bank BNK. Therefore, the second organic pattern ELP2 may be disposed on the metal pattern MP in areas adjacent to the second and third emission areas EA2 and EA3.

The second electrode pattern CEP2 may include the same metal material as the second common electrode CE2 and may be disposed on the second organic pattern ELP2. The second electrode pattern CEP2 may cover side surfaces of the second organic pattern ELP2 adjacent to the second emission area EA2. The second common electrode CE2 and the second electrode pattern CEP2 may be deposited in the same process, but may be cut by the tips formed on the inner walls of the bank BNK. Therefore, the second electrode pattern CEP2 may be disposed on the second organic pattern ELP2 in the areas adjacent to the second and third emission areas EA2 and EA3.

The second capping pattern CLP2 may include the same inorganic material as the capping layer CAP and may be disposed on the second electrode pattern CEP2. The second capping pattern CLP2 may cover side surfaces of the second electrode pattern CEP2 adjacent to the second emission area EA2. The capping layer CAP and the second capping pattern CLP2 may be deposited in the same process, but may be cut by the tips formed on the inner walls of the bank BNK. Therefore, the second capping pattern CLP2 may be disposed on the second electrode pattern CEP2 in the areas adjacent to the second and third emission areas EA2 and EA3.

The second inorganic layer TL2 may be disposed on the capping layer CAP of the second emission area EA2 and the second capping pattern CLP2. The second inorganic layer TL2 may cover the side surfaces of the first bank BNK1 surrounding the second emission area EA2. The second inorganic layer TL2 may include an inorganic material to prevent oxygen or moisture from penetrating into the second light emitting element ED2. The second inorganic layer TL2 may be an inorganic encapsulation layer. For example, the second inorganic layer TL2 may be made of any of the materials exemplified in the description of the first inorganic layer TL1.

The third organic pattern ELP3 may include the same organic material as the third light emitting layer EL and may be disposed on the second inorganic layer TL2. Here, the third organic pattern ELP3 and the third light emitting layer EL3 may be in a same layer as a plurality of organic patterns in a third organic pattern layer. The third organic pattern ELP3 may cover the side surfaces of the second bank BNK2, the first organic pattern ELP1, the first electrode pattern CEP1, the first capping pattern CLP1, the first inorganic layer TL1, the metal pattern MP, the second organic pattern ELP2, the second electrode pattern CEP2, the second capping pattern CLP2, and the second inorganic layer TL2 which are adjacent to the third emission area EA3. In an embodiment, each of the second bank layer, the first organic pattern ELP1, the first inorganic layer TL1, the metal pattern MP, the second organic pattern ELP2 and the second inorganic layer TL2 includes third side surfaces closest to the third emission area EA3, and the third organic pattern ELP3 covers the third side surfaces of the second bank layer, the third side surfaces of the first organic pattern ELP1, the third side surfaces of the first inorganic layer TL1, the third side surfaces of the metal pattern MP, the third side surfaces of the second organic pattern ELP2, and third side surfaces of the second inorganic layer TL2.

The third light emitting layer EL3 and the third organic pattern ELP3 may be deposited in the same process, but may be cut by the tips formed on the inner walls of the bank BNK. Therefore, the third organic pattern ELP3 may be disposed on the second inorganic layer TL2 in an area adjacent to the third emission area EA3.

The third electrode pattern CEP3 may include the same metal material as the third common electrode CE3 and may be disposed on the third organic pattern ELP3. The third electrode pattern CEP3 may cover side surfaces of the third organic pattern ELP3 adjacent to the third emission area EA3. The third common electrode CE3 and the third electrode pattern CEP3 may be deposited in the same process, but may be cut by the tips formed on the inner walls of the bank BNK. Therefore, the third electrode pattern CEP3 may be disposed on the third organic pattern ELP3 in the area adjacent to the third emission area EA3.

The third capping pattern CLP3 may include the same inorganic material as the capping layer CAP and may be disposed on the third electrode pattern CEP3. The third capping pattern CLP3 may cover side surfaces of the third electrode pattern CEP3 adjacent to the third emission area EA3. The capping layer CAP and the third capping pattern CLP3 may be deposited in the same process, but may be cut by the tips formed on the inner walls of the bank BNK. Therefore, the third capping pattern CLP3 may be disposed on the third electrode pattern CEP3 in the area adjacent to the third emission area EA3.

The third inorganic layer TL3 may be disposed on the capping layer CAP of the third emission area EA3 and the third capping pattern CLP3. The third inorganic layer TL3 may cover the side surfaces of the first bank BNK1 surrounding the third emission area EA3. The third inorganic layer TL3 may include an inorganic material to prevent oxygen or moisture from penetrating into the third light emitting element ED3. The third inorganic layer TL3 may be an inorganic encapsulation layer. For example, the third inorganic layer TL3 may be made of any of the materials exemplified in the description of the first inorganic layer TL1.

The encapsulation layer TFEL may be disposed on the first through third inorganic layers TL1 through TL3 to cover the light emitting element layer EML. The encapsulation layer TFEL may include first and second encapsulation layers TFE1 and TFE2.

The first encapsulation layer TFE1 may be disposed on the first through third inorganic layers TL1 through TL3 to planarize an upper side of the light emitting element layer EML. That is, where the light emitting element layer EML on the second passivation layer PAS2 includes an uneven profile in cross-section, the first encapsulation layer TFE1 may provide an even or flat upper surface along the light emitting element layer EML. The first encapsulation layer TFE1 may include an organic material to protect the light emitting element layer EML from foreign substances such as dust. For example, the first encapsulation layer TFE1 may include an organic layer such as acryl resin, epoxy resin, phenolic resin, polyamide resin, or polyimide resin. The first encapsulation layer TFE1 may be formed by curing a monomer or applying a polymer.

The second encapsulation layer TFE2 may be disposed on the first encapsulation layer TFE1. The second encapsulation layer TFE2 may include an inorganic material to prevent oxygen or moisture from penetrating into the light emitting element layer EML. For example, the second encapsulation layer TFE2 may include, but not limited to, at least one of a silicon nitride layer, a silicon oxynitride layer, a silicon oxide layer, a titanium oxide layer, an aluminum oxide layer, and an amorphous silicon layer.

The touch sensing unit TSU may be disposed on the encapsulation layer TFEL. The touch sensing unit TSU may include a third buffer layer BF3, a bridge electrode BRG, a second insulating layer IL2, touch electrodes TE, and a third insulating layer IL3.

The third buffer layer BF3 may be disposed on the encapsulation layer TFEL. The third buffer layer BF3 may have insulating and optical functions. The third buffer layer BF3 may include at least one inorganic layer. Optionally, the third buffer layer BF3 may be omitted.

The bridge electrode BRG may be disposed on the third buffer layer BF3. The bridge electrode BRG may be disposed on a different layer (or in a different layer) from the touch electrodes TE and may electrically connect adjacent touch electrodes TE to each other.

The second insulating layer IL2 may be disposed on the bridge electrode BRG and the third buffer layer BF3. The second insulating layer IL2 may have insulating and optical functions. For example, the second insulating layer IL2 may be an inorganic layer including at least one of a silicon nitride layer, a silicon oxynitride layer, a silicon oxide layer, a titanium oxide layer, and an aluminum oxide layer.

The touch electrodes TE may be disposed on the second insulating layer IL2. The touch electrodes TE may include a driving electrode and a sensing electrode and may sense a change in mutual capacitance between the driving electrode and the sensing electrode. The touch electrodes TE may not overlap the first through third emission areas EA1 through EA3. As not overlapping, elements may be adjacent to each other and/or spaced apart from each other in a plan view, such as in a direction along the substrate SUB, along the thin-film transistor layer TFTL, along the light emitting element layer EML, etc.

Each of the touch electrodes TE may be a single layer of molybdenum (Mo), titanium (Ti), copper (Cu), aluminum (Al) or indium tin oxide (ITO) or may be a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The third insulating layer IL3 may be disposed on the touch electrodes TE and the second insulating layer IL2. The third insulating layer IL3 may have insulating and optical functions. The third insulating layer IL3 may be made of any of the materials exemplified in the description of the second insulating layer IL2.

The color filter layer CFL may be disposed on the touch sensing unit TSU. The color filter layer CFL may include the light blocking member BM, a plurality of color filters CF, and a planarization layer OC.

The light blocking member BM may be disposed on the third insulating layer IL3 to surround first through third optical areas OPT1 through OPT3 in a plan view. The light blocking member BM may overlap the touch electrodes TE. The light blocking member BM may include a light absorbing material to prevent reflection of light. For example, the light blocking member BM may include an inorganic black pigment, an organic black pigment, or an organic blue pigment. The inorganic black pigment may be a metal oxide such as carbon black or titanium black, the organic black pigment may include at least one of lactam black, perylene black and aniline black, and the organic blue pigment may be C.I pigment blue. However, the present disclosure is not limited thereto. The light blocking member BM may prevent color mixing between adjacent light emission areas by preventing intrusion of visible light between the first through third emission areas EA1 through EA3, thereby improving a color gamut of the display device 10.

The color filters CF may include first through third color filters CF1 through CF3. The first through third color filters CF1 through CF3 may be disposed on the third insulating layer IL3 to correspond to the first through third emission areas EA1 through EA3, respectively.

The first color filter CF1 may be disposed on the third insulating layer IL3 in the first emission area EA1. The first color filter CF1 may be surrounded by the light blocking member BM in the plan view. Edges of the first color filter CF1 may partially cover an upper surface of the light blocking member BM, but the present disclosure is not limited thereto. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the third insulating layer IL3 in the second emission area EA2. The second color filter CF2 may be surrounded by the light blocking member BM in the plan view. Edges of the second color filter CF2 may partially cover the upper surface of the light blocking member BM, but the present disclosure is not limited thereto. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be disposed on the third insulating layer IL3 in the third emission area EA3. The third color filter CF3 may be surrounded by the light blocking member BM in the plan view. Edges of the third color filter CF3 may partially cover the upper surface of the light blocking member BM, but the present disclosure is not limited thereto. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The first through third color filters CF1 through CF3 may absorb a part of external light coming from the outside of the display device 10, thereby reducing reflected light due to the external light. Therefore, the first through third color filters CF1 through CF3 may prevent color distortion due to reflection of external light.

The planarization layer OC may be disposed on the light blocking member BM and the first through third color filters CF1 through CF3. The planarization layer OC may planarize an upper end of the color filter layer CFL. For example, the planarization layer OC may include an organic insulating material.

Referring to FIGS. 4-6, a first stacked structure may include the layer of the first organic patterns ELP1 to the first inorganic layer TL1, inclusive. The first stacked structure may be disposed between each pair of adjacent emission areas, such as corresponding to each of the banks BNK. A second stacked structure may include the layer of the second organic patterns ELP2 to the second inorganic layer TL2, inclusive. A third stacked structure may include the layer of the third organic patterns ELP3 to the third inorganic layer TL3, inclusive. The third stacked structure may be disposed corresponding to only the banks BNK which define a respective hole at the third emission area EA3. More particularly, the third stacked structure is disposed at bank sides which are adjacent to (or closest to) the respective hole at the third emission area EA3. The second stacked structure is disposed at bank sides which are closest to and define the respective holes at both the second emission area EA2 and the third emission area EA3. Referring to FIG. 4, the stacked structure visible on the leftmost bank may be the stacked structure of the right side of the rightmost bank, without being limited thereto, and vice versa.

FIGS. 7 through 36 are cross-sectional views illustrating a process of manufacturing or providing a display device 10 according to an embodiment.

Figure 7:
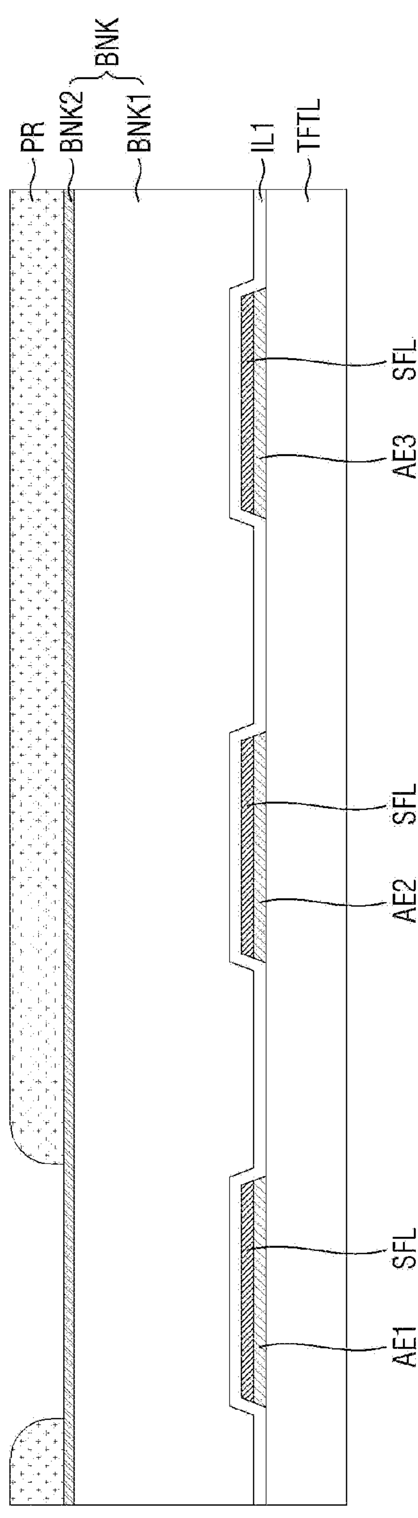
FIGS. 7 through 36 are cross-sectional views illustrating a process of manufacturing a display device according to an embodiment.

In FIG. 7, first through third pixel electrodes AE1 through AE3 may be spaced apart from each other along a thin-film transistor layer TFTL. The first through third pixel electrodes AE1 through AE3 may include at least one of silver (Ag), copper (Cu), aluminum (Al), nickel (Ni), and lanthanum (La). For another example, the first through third pixel electrodes AE1 through AE3 may include a material such as indium tin oxide (ITO), indium zinc oxide (IZO), or indium tin zinc oxide (ITZO). For another example, the first through third pixel electrodes AE1 through AE3 may have a stacked structure of ITO/Ag/ITO, ITO/Ag/IZO, or ITO/Ag/ITZO/IZO.

A sacrificial layer SFL may be disposed on the first through third pixel electrodes AE1 through AE3. A first sacrificial pattern, a second sacrificial pattern and a third sacrificial pattern of the sacrificial layer SFL may be disposed between upper surfaces of the first through third pixel electrodes AE1 through AE3, and a first insulating layer IL1, respectively. The sacrificial layer SFL may include an oxide semiconductor. For example, the sacrificial layer SFL may include at least one of indium gallium zinc oxide (IGZO), zinc tin oxide (ZTO), and indium zinc oxide (IZO).

The first insulating layer IL1 may be disposed on the thin-film transistor layer TFTL and the sacrificial layer SFL. The first insulating layer IL1 may include an inorganic insulating material. The first insulating layer IL1 may include, but not limited to, at least one of a silicon nitride layer, a silicon oxynitride layer, a silicon oxide layer, a titanium oxide layer, an aluminum oxide layer, and an amorphous silicon layer.

A first bank material layer as a preliminary first bank (hereinafter referred to as a first bank BNK1) may be disposed on the first insulating layer IL1, and a second bank material layer as a preliminary second bank (hereinafter referred to as a second bank BNK2) may be disposed on the first bank BNK1. A thickness of the first bank BNK1 may be greater than that of the second bank BNK2.

A photoresist PR may be disposed on the second bank BNK2 not to overlap the first pixel electrode AE1. The photoresist PR may be provided except for an area where a first emission area EA1 is to be formed. That is, the photoresist PR may be excluded from a planar area correspond to the first pixel electrode AE1 and/or the first emission area EA1.

Figure 8:
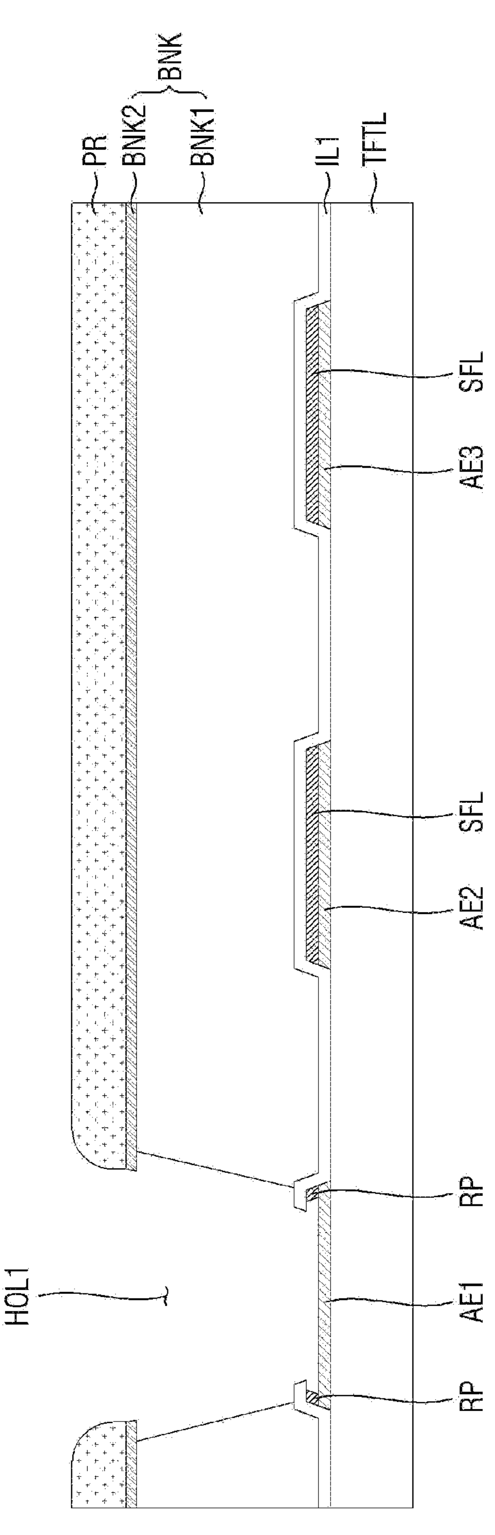

In FIG. 8, the second bank BNK2, the first bank BNK1, the first insulating layer IL1, and the sacrificial layer SFL may be sequentially etched to form a first hole HOL1. The first hole HOL1 may overlap the first emission area EA1.

The first and second banks BNK1 and BNK2 may be etched by performing at least one of a dry etching process and a wet etching process. For example, the first and second banks BNK1 and BNK2 may be initially etched through the dry etching process and then may be etched through the wet etching process. However, the present disclosure is not limited thereto.

The first and second banks BNK1 and BNK2 may include different metal materials, and etching rates of the first and second banks BNK1 and BNK2 may be different from each other. In the wet etching process, the etching rate of the first bank BNK1 may be higher than that of the second bank BNK2, and the first bank BNK1 may be etched more than the second bank BNK2. Therefore, the lateral shapes or the cross-sectional shape of the sidewalls of the first and second banks BNK1 and BNK2 at the first hole HOL1 may be determined by a difference in etching rate between the first and second banks BNK1 and BNK2. As a result of the difference in etch rates, the second bank BNK2 may include tips protruding further from a sidewall of the first bank BNK1 and in a direction toward the first hole HOL1. Side surfaces or sidewalls of the first bank BNK1 may be recessed inward from side surfaces of the second bank BNK2. An undercut structure may be formed under the tips of the second bank BNK2. The thickness of the first bank BNK1 may be greater than that of the second bank BNK2.

The first bank BNK1 may include a metal material having high electrical conductivity, and the second bank BNK2 may include a material having low reflectivity. For example, the first bank BNK1 may include aluminum (Al), and the second bank BNK2 may include titanium (Ti). However, the present disclosure is not limited thereto.

The first insulating layer IL1 and the sacrificial layer SFL may be etched by performing at least one of a dry etching process and a wet etching process. For example, the first insulating layer IL1 may be etched through the dry etching process, and the sacrificial layer SFL may be etched through the wet etching process. However, the present disclosure is not limited thereto. As the first insulating layer IL1 and the sacrificial layer SFL are etched, at least a portion of the upper surface of the first pixel electrode AE1 may be exposed to define an exposed portion of the pixel electrode. In the wet etching process, the sacrificial layer SFL may be etched more than the first insulating layer IL1 in the plan view. When the sacrificial layer SFL is etched, a portion of the first sacrificial pattern corresponding may be removed and a residual pattern RP of the first sacrificial pattern may remain between the first insulating layer IL1 and the first pixel electrode AE1. Accordingly, side surfaces of the residual pattern RP as a first residual pattern may be recessed inward from side surfaces of the first insulating layer IL1.

Figure 9:
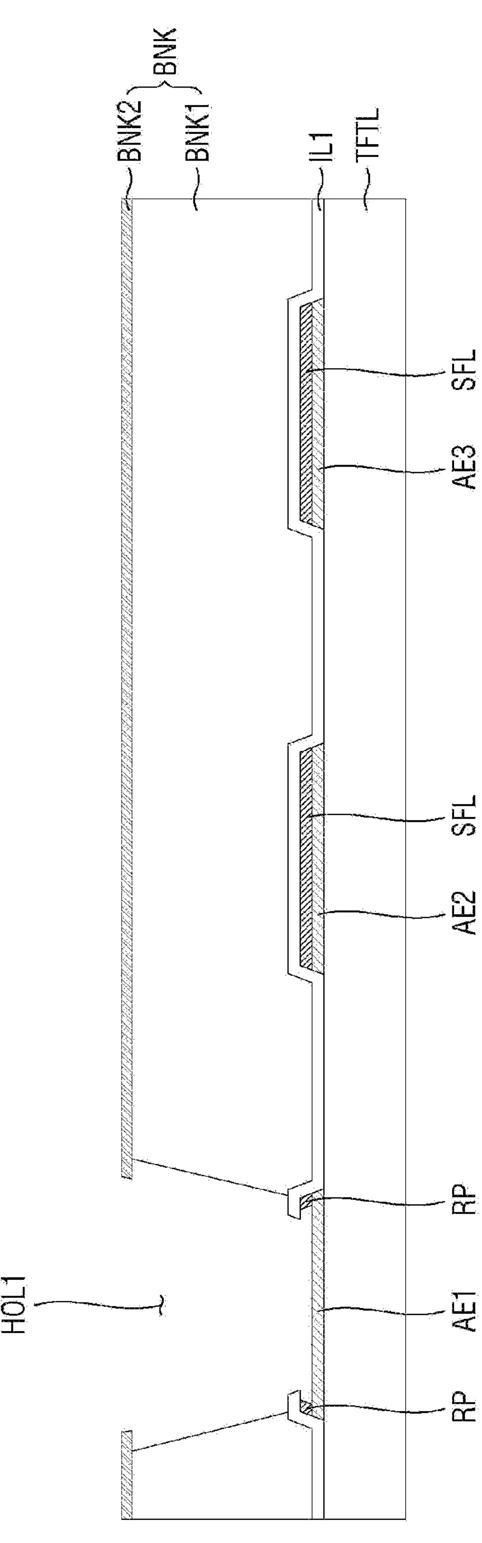

In FIG. 9, the photoresist PR of FIGS. 7 and 8 as a first photoresist pattern may be removed through a strip process after the first hole HOL1 is formed.

Figure 10:
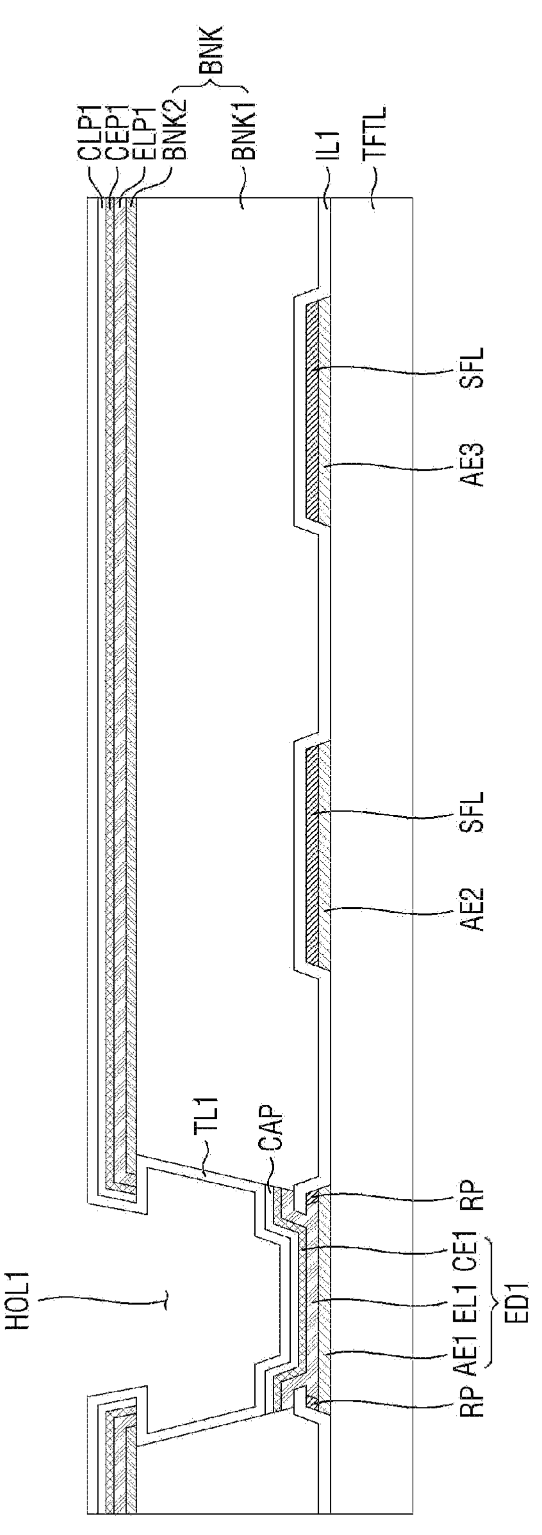

In FIG. 10, a first light emitting layer EL1 may be directly disposed on the exposed portion of first pixel electrode AE1 in the first emission area EA1. A portion of the first light emitting layer EL1 may fill a space surrounded by the first pixel electrode AE1, the residual pattern RP and the first insulating layer IL1, and the other portion of the first light emitting layer EL1 may cover a portion of an upper surface of the first insulating layer IL1.

An organic material for forming the first light emitting layer EL1 and a first organic pattern ELP1 may be deposited on the entire surface of the display device 10. The first organic pattern ELP1 may include the same organic material as the first light emitting layer EL1 and may be disposed on the second bank BNK2. The first organic pattern ELP1 may cover the side surfaces of the second bank BNK2 adjacent to the first emission area EA1. The first light emitting layer EL1 and the first organic pattern ELP1 may be deposited in the same process, but may be cut or disconnected by protrusion of the tips formed on inner walls of a bank BNK. Therefore, the first organic pattern ELP1 may be disposed on the second bank BNK2 in areas other than the first emission area EA1. That is, while the first light emitting layer EL1 and the first organic pattern ELP1 are in a same layer, the first light emitting layer EL1 and the first organic pattern ELP1 are disconnected from each other at the first emission area EA1.

A first common electrode CE1 may be disposed on the first light emitting layer EL1. The first common electrode CE1 may include a transparent conductive material and transmit light generated from the first light emitting layer EL1. The first common electrode CE1 may contact side surfaces of the bank BNK. Therefore, a first light emitting element ED1 may be formed in the first hole HOL1 and may emit light through the first emission area EA1.

A metal material for forming the first common electrode CE1 and a first electrode pattern CEP1 may be deposited on the entire surface of the display device 10. The first electrode pattern CEP1 may include the same metal material as the first common electrode CE1 and may be disposed on the first organic pattern ELP1. The first electrode pattern CEP1 may cover side surfaces of the first organic pattern ELP1 adjacent to the first emission area EA1. The first common electrode CE1 and the first electrode pattern CEP1 may be deposited in the same process, but may be cut by the tips formed on the inner walls of the bank BNK. Therefore, the first electrode pattern CEP1 may be disposed on the first organic pattern ELP1 in the areas other than the first emission area EA1. That is, while the first common electrode CE1 and the first electrode pattern CEP1 are in a same layer, the first common electrode CE1 and the first electrode pattern CEP1 are disconnected from each other at the first emission area EA1.

A first lower capping pattern among first to third lower capping patterns of the capping layer CAP may be disposed on the first common electrode CE1. The capping layer CAP may include an inorganic insulating material and may cover the first light emitting element ED1. The capping layer CAP may prevent the first light emitting element ED1 from being damaged by external air. For example, the capping layer CAP may include, but not limited to, at least one of a silicon nitride layer, a silicon oxynitride layer, a silicon oxide layer, a titanium oxide layer, an aluminum oxide layer, and an amorphous silicon layer.

An inorganic material for forming the capping layer CAP and a first capping pattern CLP1 may be deposited on the entire surface of the display device 10. The first capping pattern CLP1 may include the same inorganic material as the capping layer CAP and may be disposed on the first electrode pattern CEP1. The first capping pattern CLP1 may cover side surfaces of the first electrode pattern CEP1 adjacent to the first emission area EA1. The capping layer CAP and the first capping pattern CLP1 may be deposited in the same process, but may be cut by the tips formed on the inner walls of the bank BNK. Therefore, the first capping pattern CLP1 may be disposed on the first electrode pattern CEP1 in the areas other than the first emission area EA1. That is, while the capping layer CAP and the first capping pattern CLP1 are in a same layer, the capping layer CAP and the first capping pattern CLP1 are disconnected from each other at the first emission area EA1.

A first inorganic layer TL1 may be disposed on the capping layer CAP of the first emission area EA1 and the first capping pattern CLP1. The first inorganic layer TL1 may cover the side surfaces of the first bank BNK1 surrounding the first emission area EA1. The first inorganic layer TL1 may include an inorganic material to prevent oxygen or moisture from penetrating into the first light emitting element ED1. The first inorganic layer TL1 may be an inorganic encapsulation layer. For example, the first inorganic layer TL1 may include, but not limited to, at least one of a silicon nitride layer, a silicon oxynitride layer, a silicon oxide layer, a titanium oxide layer, an aluminum oxide layer, and an amorphous silicon layer.

Figure 11:
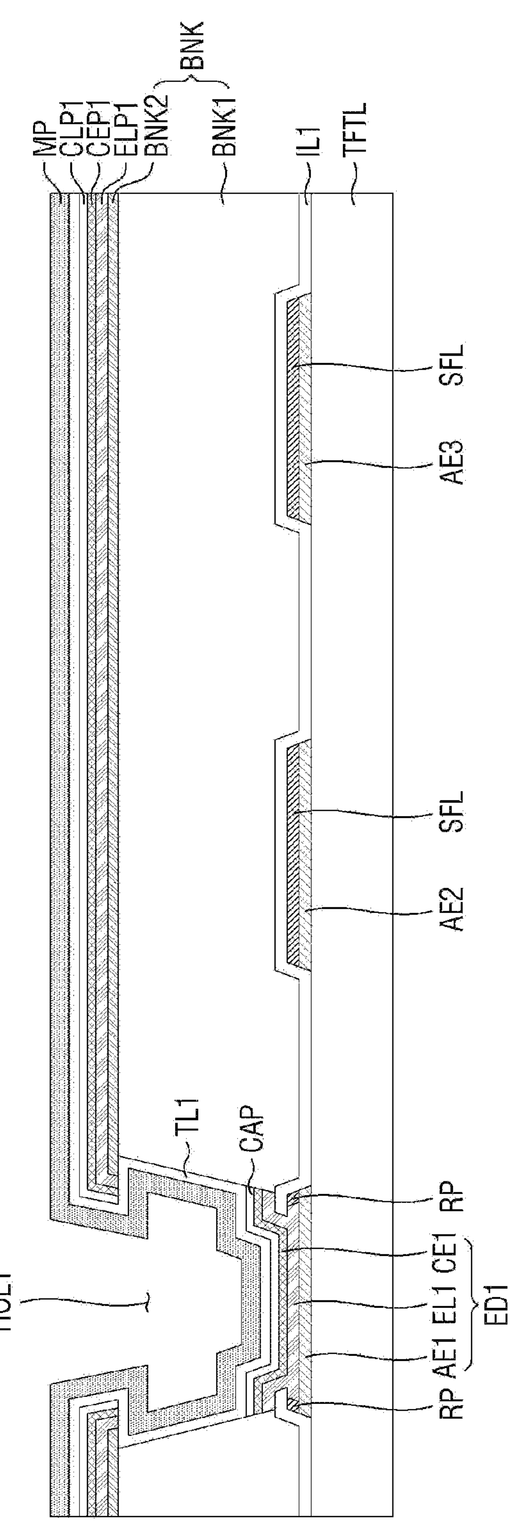

In FIG. 11, a metal layer (indicated by MP) may be disposed on the first inorganic layer TL1. A metal material for forming the metal pattern MP may be deposited on the entire surface of the display device 10. The metal pattern MP may include at least one of indium tin oxide (ITO), indium zinc oxide (IZO), indium tin zinc oxide (ITZO), indium gallium zinc oxide (IGZO), indium gallium oxide (IGO), indium tin gallium oxide (ITGO), and indium tin gallium zinc oxide (ITGZO).

Figure 12:
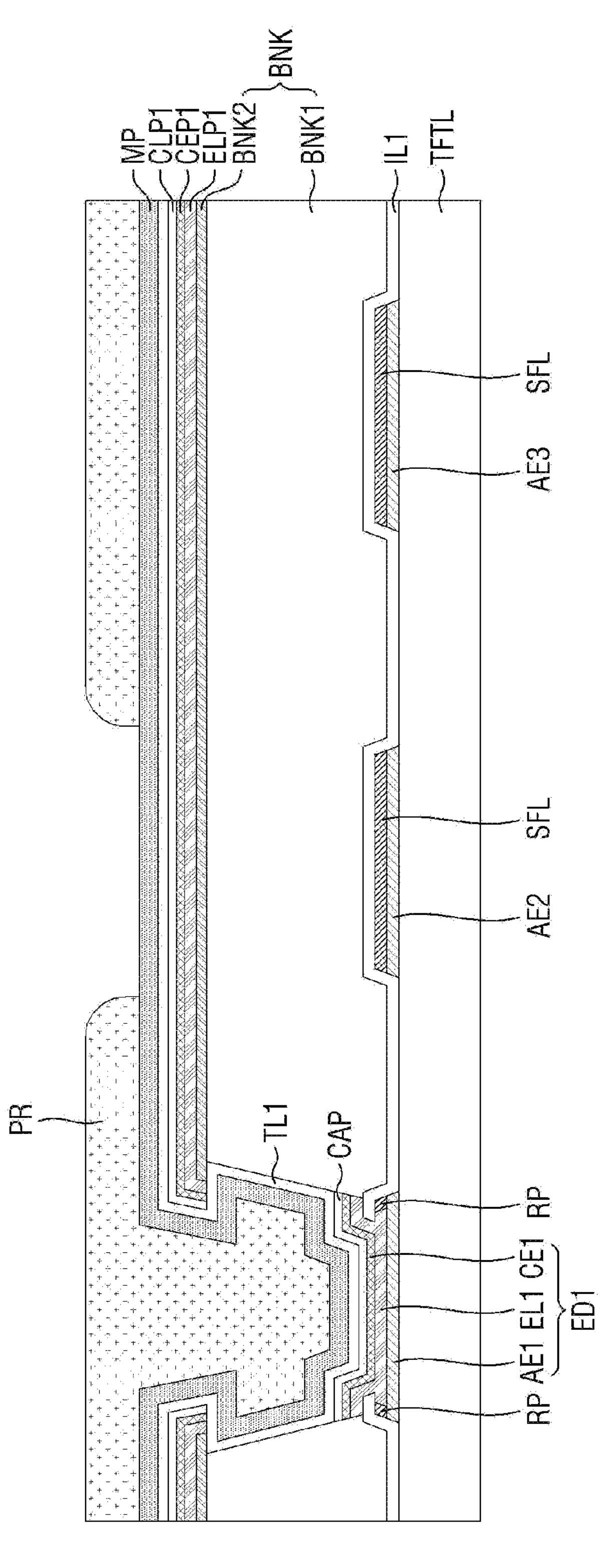

In FIG. 12, a photoresist PR (as a second photoresist pattern) may be disposed on the metal pattern MP, not to overlap the second pixel electrode AE2, and define an exposed portion of the first metal pattern material layer. The photoresist PR may be provided except for an area where a second emission area EA2 is to be formed.

Figure 13:
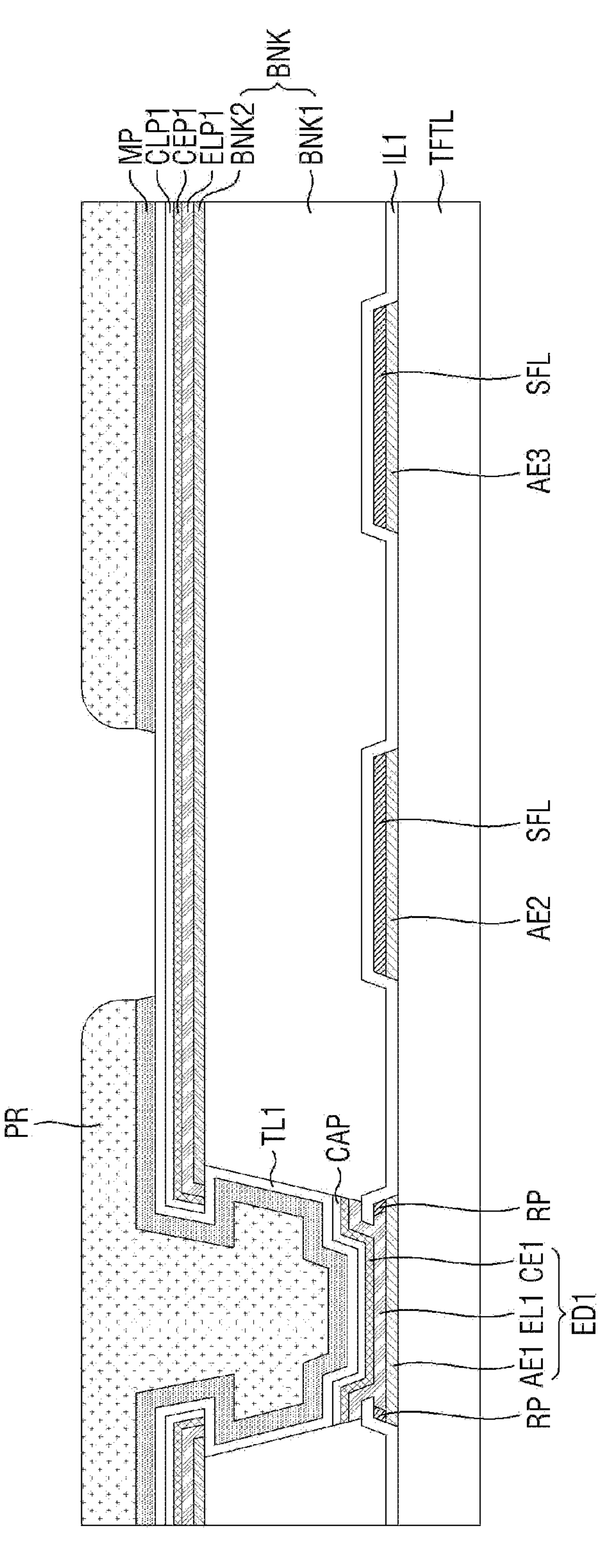

In FIG. 13, the metal pattern MP corresponding to the second emission area EA2 may be etched using the photoresist PR as a mask. The metal pattern MP may be etched by performing a wet etching process. The metal pattern MP may be patterned in an area overlapping the second pixel electrode AE2. The metal pattern MP may be etched in an area where a second hole HOL2 (see FIG. 15) or the second emission area EA2 is to be formed.

Figure 14:
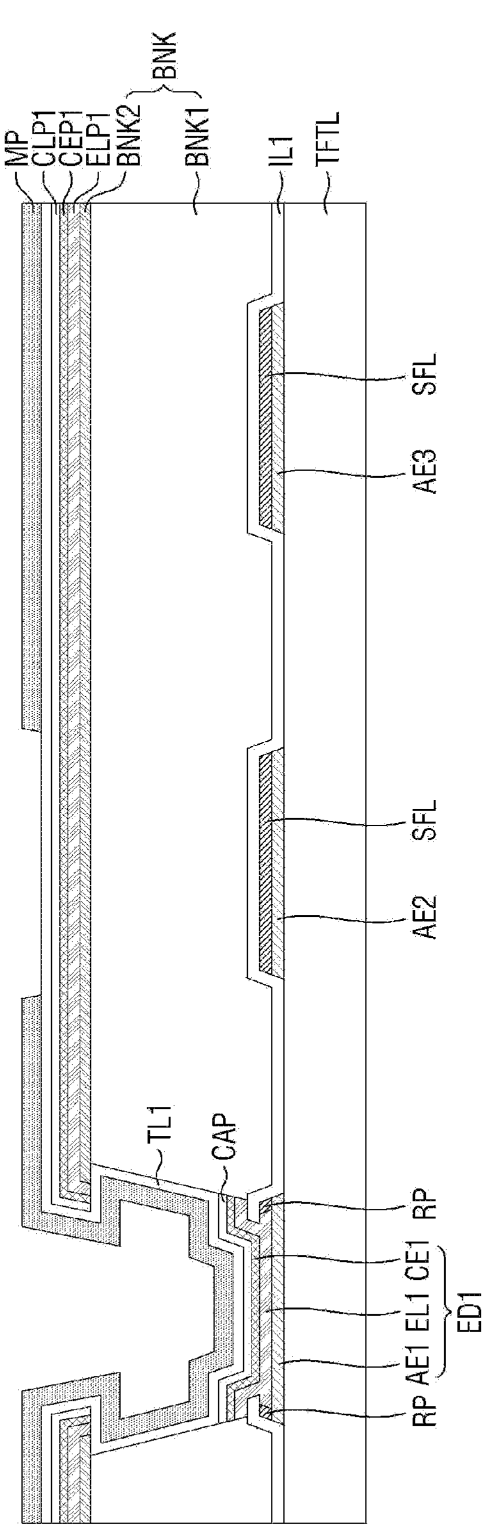

In FIG. 14, the photoresist PR may be removed through a strip process after the metal pattern MP is etched. The first organic pattern ELP1 may not be exposed in the strip process of the photoresist PR. That is, the layer of the first organic patterns EL1 and ELP1 remain covered during the stripping process to remove the second photoresist pattern.

Figure 15:
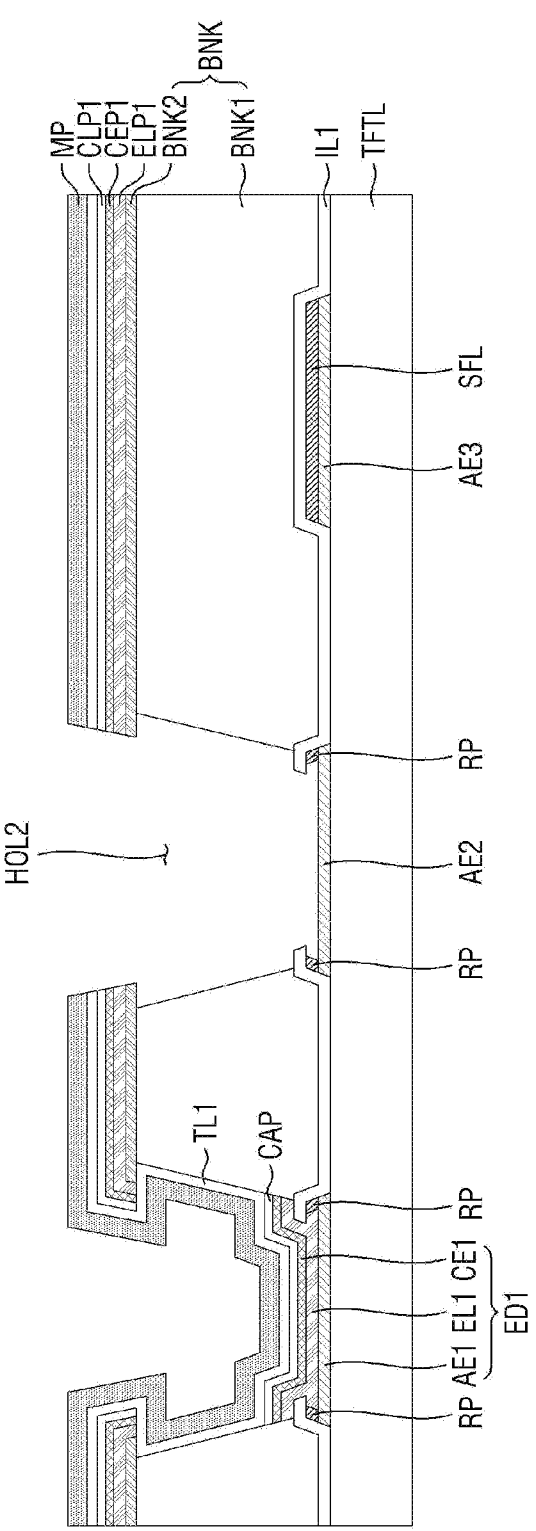

In FIG. 15, the metal pattern MP may serve as a mask in the process of forming the second hole HOL2 corresponding to the second emission area EA2. For example, the metal pattern MP may include indium tin oxide (ITO) to serve as a hard mask in the process of forming the second hole HOL2.

For example, when the second hole HOL2 is conventionally formed using a photoresist as a mask, the photoresist may be removed through a strip process after the second hole HOL2 is formed. If there is an exposed organic layer in the strip process of the photoresist, a chemical solution used in the strip process may penetrate into the organic layer to melt the organic layer, and layers disposed on the organic layer may be undesirably lifted.

Therefore, in one or more embodiment, the second hole HOL2 and the second emission area EA2 may be formed using the metal pattern MP in the display device 10 as a mask. Accordingly, the exposure of the first organic pattern ELP1 in the photoresist strip process can be avoided, and the peeling of the first electrode pattern CEP1 together with the first capping pattern CLP1 and the first inorganic layer TL1 on the first organic pattern ELP1 can be prevented.

The first inorganic layer TL1, the first capping pattern CLP1, the first electrode pattern CEP1, the first organic pattern ELP1, the second bank BNK2, the first bank BNK1, the first insulating layer IL1 and the sacrificial layer SFL as a second sacrificial pattern, may be sequentially etched to form the second hole HOL2. The second hole HOL2 may overlap the second emission area EA2. The first inorganic layer TL1, the first capping pattern CLP1, the first electrode pattern CEP1, and the first organic pattern ELP1 of a preliminary first stacked structure may be etched by performing at least one of a dry etching process and a wet etching process. The process of sequentially etching the second bank BNK2, the first bank BNK1, the first insulating layer IL1, and the sacrificial layer SFL may be substantially the same as the process of forming the first hole HOL1 except that the metal pattern MP is used as a hard mask.

Figure 16:
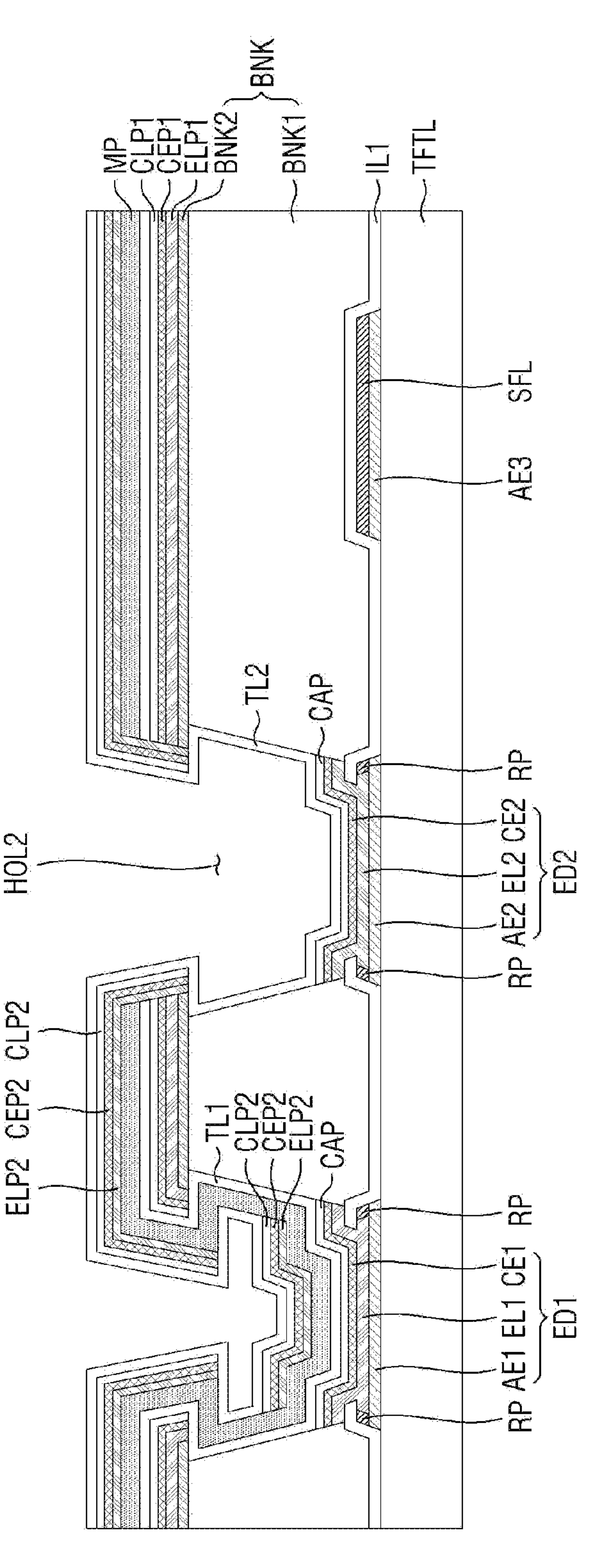

In FIG. 16, a second light emitting layer EL2 may be directly disposed on the second pixel electrode AE2 in the second emission area EA2. A portion of the second light emitting layer EL2 may fill a space surrounded by the second pixel electrode AE2, a residual pattern RP as a second residual pattern and the first insulating layer IL1, and the other portion of the second light emitting layer EL2 may cover a portion of the upper surface of the first insulating layer IL1.

An organic material for forming the second light emitting layer EL2 and a second organic pattern ELP2 may be deposited on the entire surface of the display device 10. The second organic pattern ELP2 may include the same organic material as the second light emitting layer EL2 and may be disposed on the metal pattern MP. The second organic pattern ELP2 may cover the side surfaces of the second bank BNK2, the first organic pattern ELP1, the first electrode pattern CEP1, the first capping pattern CLP1, the first inorganic layer TL1, and the metal pattern MP which are adjacent to the second emission area EA2. The second light emitting layer EL2 and the second organic pattern ELP2 may be deposited in the same process, but may be cut by tips formed on the inner walls of the bank BNK. Therefore, the second organic pattern ELP2 may be disposed on the metal pattern MP in areas other than the second emission area EA2.

A second common electrode CE2 may be disposed on the second light emitting layer EL2. The second common electrode CE2 may include a transparent conductive material and transmit light generated from the second light emitting layer EL2. The second common electrode CE2 may contact the side surfaces of the bank BNK. Therefore, a second light emitting element ED2 may be formed in the second hole HOL2 and may emit light through the second emission area EA2.

A metal material for forming the second common electrode CE2 and a second electrode pattern CEP2 may be deposited on the entire surface of the display device 10. The second electrode pattern CEP2 may include the same metal material as the second common electrode CE2 and may be disposed on the second organic pattern ELP2. The second electrode pattern CEP2 may cover side surfaces of the second organic pattern ELP2 adjacent to the second emission area EA2. The second common electrode CE2 and the second electrode pattern CEP2 may be deposited in the same process, but may be cut by the tips formed on the inner walls of the bank BNK. Therefore, the second electrode pattern CEP2 may be disposed on the second organic pattern ELP2 in the areas other than the second emission area EA2.

A second lower capping pattern of the capping layer CAP may be disposed on the second common electrode CE2. The capping layer CAP may include an inorganic insulating material and may cover the second light emitting element ED2. The capping layer CAP may prevent the second light emitting element ED2 from being damaged by external air.

An inorganic material for forming the capping layer CAP and a second capping pattern CLP2 may be deposited on the entire surface of the display device 10. The second capping pattern CLP2 may include the same inorganic material as the capping layer CAP and may be disposed on the second electrode pattern CEP2. The second capping pattern CLP2 may cover side surfaces of the second electrode pattern CEP2 adjacent to the second emission area EA2. The capping layer CAP and the second capping pattern CLP2 may be deposited in the same process, but may be cut by the tips formed on the inner walls of the bank BNK. Therefore, the second capping pattern CLP2 may be disposed on the second electrode pattern CEP2 in the areas other than the second emission area EA2.

A second inorganic layer TL2 may be disposed on the capping layer CAP of the second emission area EA2 and the second capping pattern CLP2. The second inorganic layer TL2 may cover the side surfaces of the second bank BNK2 surrounding the second emission area EA2. The second inorganic layer TL2 may include an inorganic material to prevent oxygen or moisture from penetrating into the second light emitting element ED2. The second inorganic layer TL2 may be an inorganic encapsulation layer. For example, the second inorganic layer TL2 may be made of any of the materials exemplified in the description of the first inorganic layer TL1.

Figure 17:
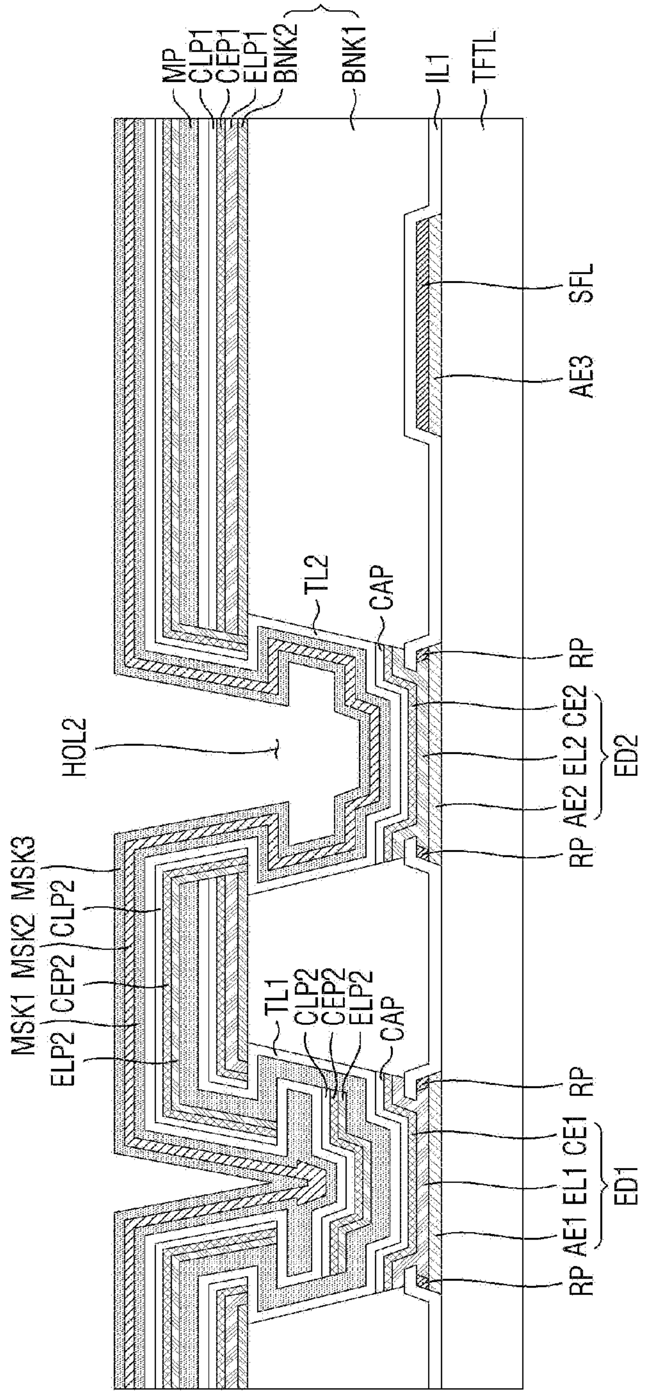

In FIG. 17, first through third metal mask layers (indicated by MSK1 through MSK3) may be sequentially disposed on the second inorganic layer TL2 as. Metal materials for forming the first through third metal masks MSK1 through MSK3 may be deposited on the entire surface of the display device 10. Each of the first through third metal masks MSK1 through MSK3 may include at least one of indium tin oxide (ITO), indium zinc oxide (IZO), indium tin zinc oxide (ITZO), indium gallium zinc oxide (IGZO), indium gallium oxide (IGO), indium tin gallium oxide (ITGO), indium tin gallium zinc oxide (ITGZO), silver (Ag), copper (Cu), aluminum (Al), molybdenum (Mo), titanium (Ti), nickel (Ni), and lanthanum (La). The first and third metal masks MSK1 and MSK3 may include the same metal material and may include a different metal material from the second metal mask MSK2. The first and third metal masks MSK1 and MSK3 may include the same metal material as the metal pattern MP. For example, the first and third metal masks MSK1 and MSK3 may include indium tin oxide (ITO), and the second metal mask MSK2 may include aluminum (Al). However, the present disclosure is not limited thereto.

Figure 18:
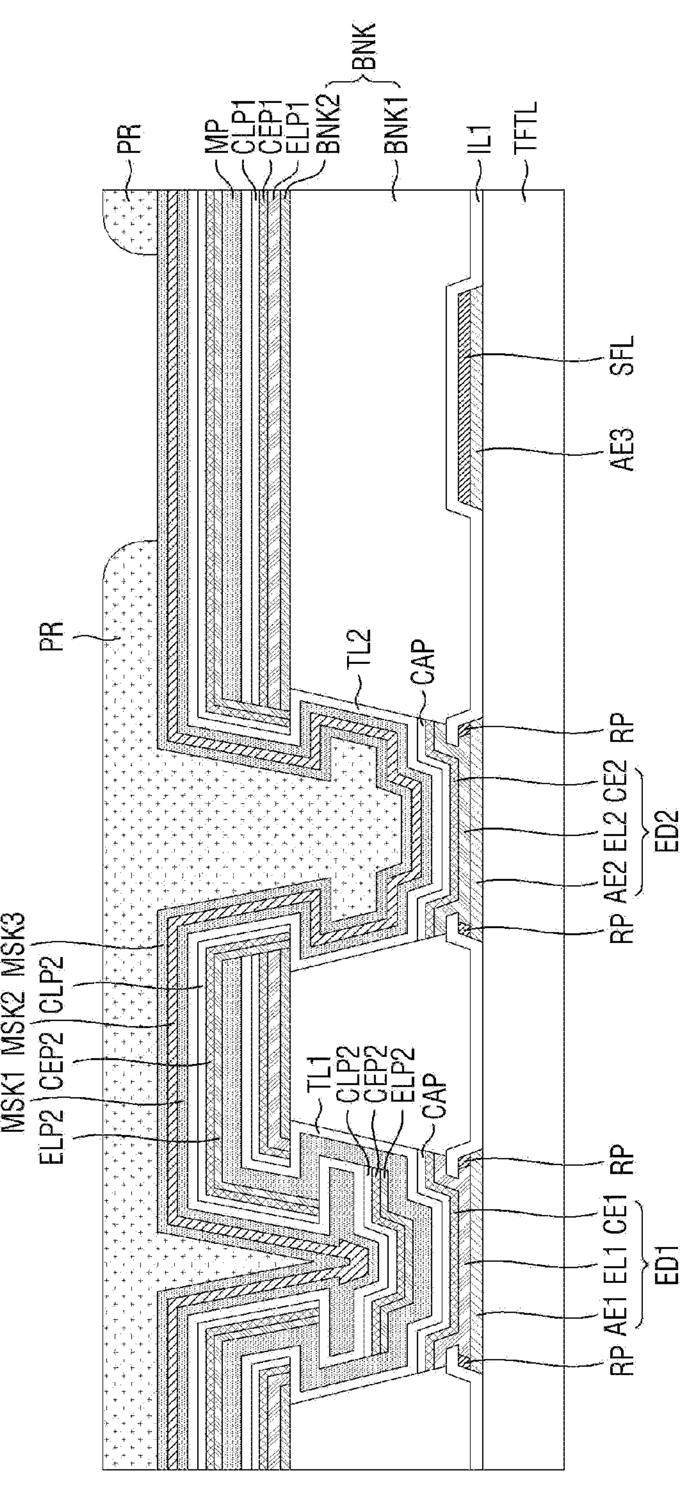

In FIG. 18, a photoresist PR as a third photoresist pattern may be disposed on the metal pattern MP not to overlap the third pixel electrode AE3. The photoresist PR may be provided except for an area where a third emission area EA3 is to be formed.

Figure 19:
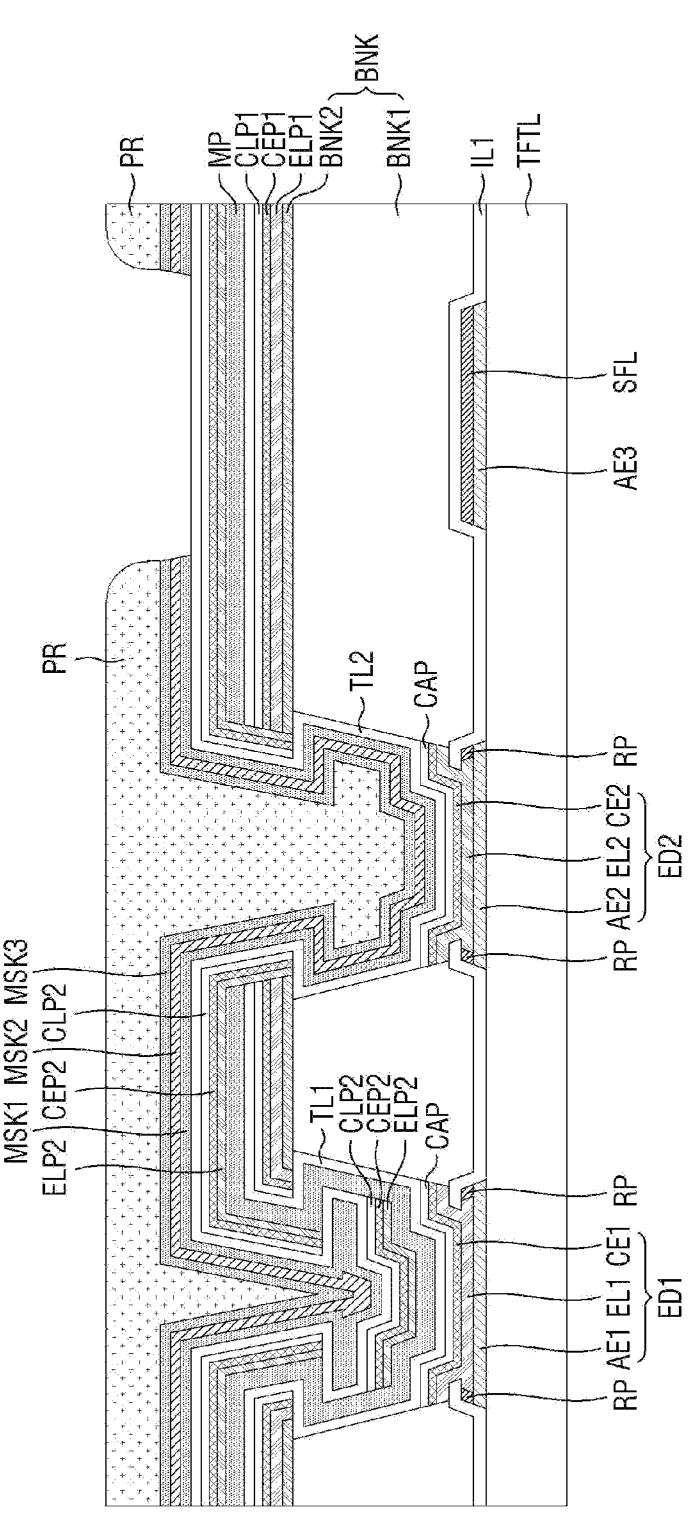

In FIG. 19, the first through third metal masks MSK1 through MSK3 may be etched using the photoresist PR as a mask. The first through third metal masks MSK1 through MSK3 may be etched by performing a wet etching process. The first through third metal masks MSK1 through MSK3 may be patterned in an area overlapping the third pixel electrode AE3. The first through third metal masks MSK1 through MSK3 may be etched in an area where a third hole HOL3 (see FIG. 23) or the third emission area EA3 is to be formed.

Figure 20:
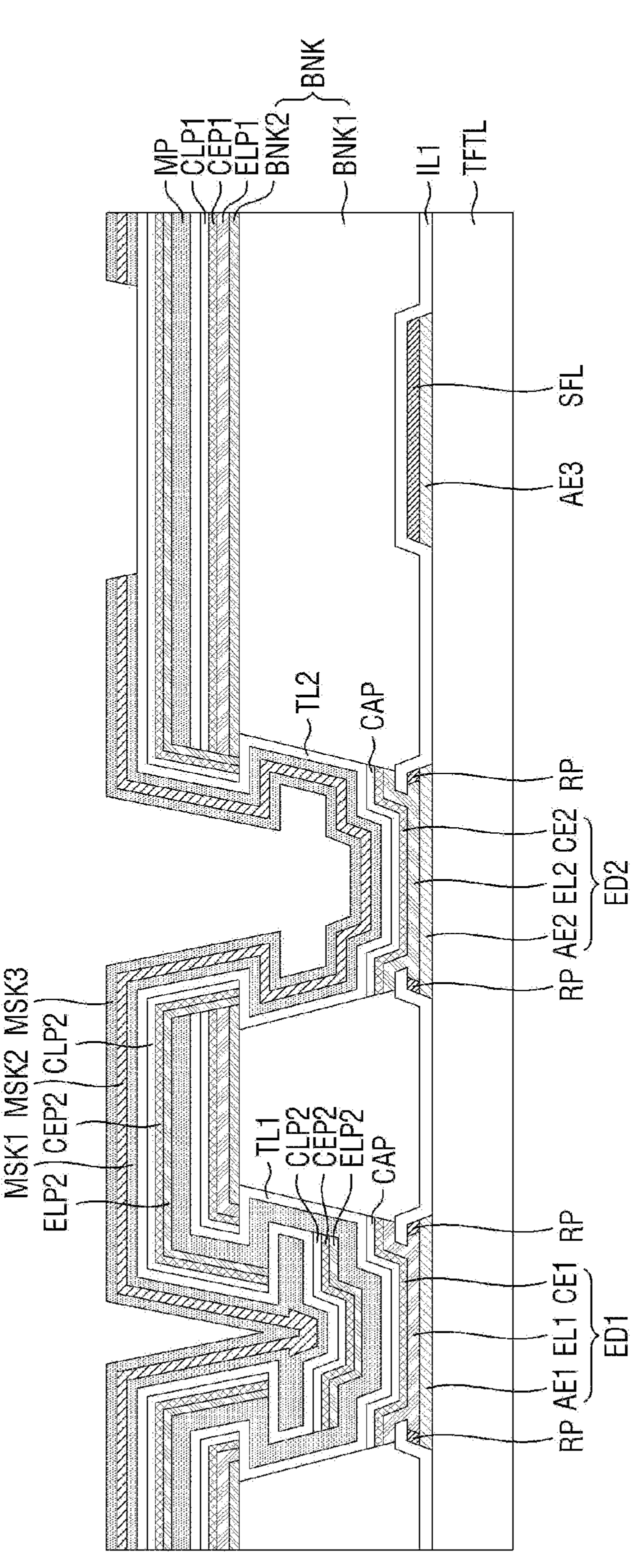

In FIG. 20, the photoresist PR of FIG. 19 may be removed through a strip process after the first through third metal masks MSK1 through MSK3 are etched. The first and second organic patterns ELP1 and ELP2 may not be exposed in the strip process of the photoresist PR. Again respective organic patterns are covered during the strip process.

Figure 21:
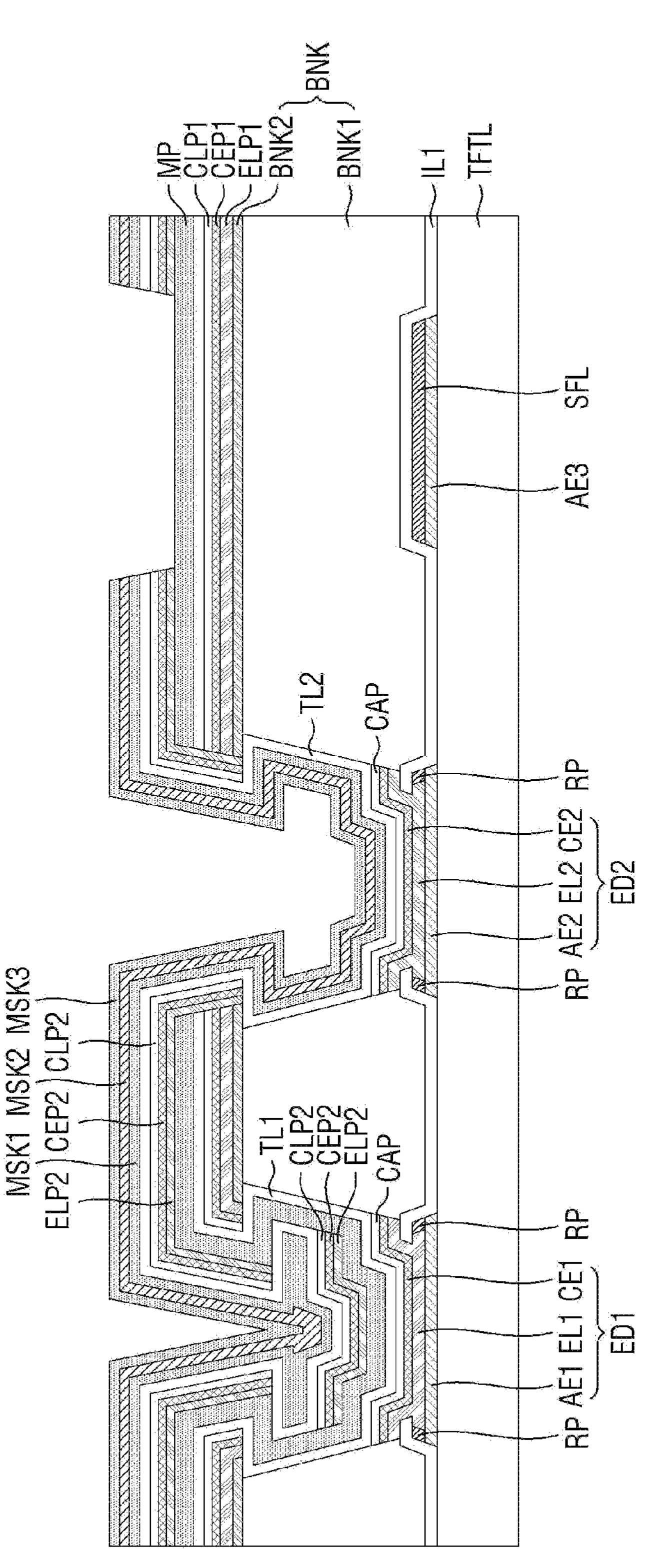

In FIG. 21, the first through third metal masks MSK1 through MSK3 may serve as masks in the process of forming the third hole HOL3. For example, the first and third metal masks MSK1 and MSK3 may include indium tin oxide (ITO), and the second metal mask MSK2 may include aluminum (Al) to serve as hard masks in the process of forming the third hole HOL3.

Therefore, since the third emission area EA3 is formed using the first through third metal masks MSK1 through MSK3 in the display device 10, the exposure of the second organic pattern ELP2 in the photoresist strip process can be avoided, and the peeling of the second electrode pattern CEP2, the second capping pattern CLP2 and the second inorganic layer TL2 on the second organic pattern ELP2 can be prevented.

The second inorganic layer TL2, the second capping pattern CLP2, the second electrode pattern CEP2, and the second organic pattern ELP2 of a preliminary second stacked structure may be sequentially etched. Therefore, the metal pattern MP may be exposed in an area overlapping the third pixel electrode AE3, and the third metal mask MSK3 may be exposed in areas not overlapping the third pixel electrode AE3. The second inorganic layer TL2, the second capping pattern CLP2, the second electrode pattern CEP2, and the second organic pattern ELP2 may be etched by performing at least one of a dry etching process and a wet etching process.

Figure 22:
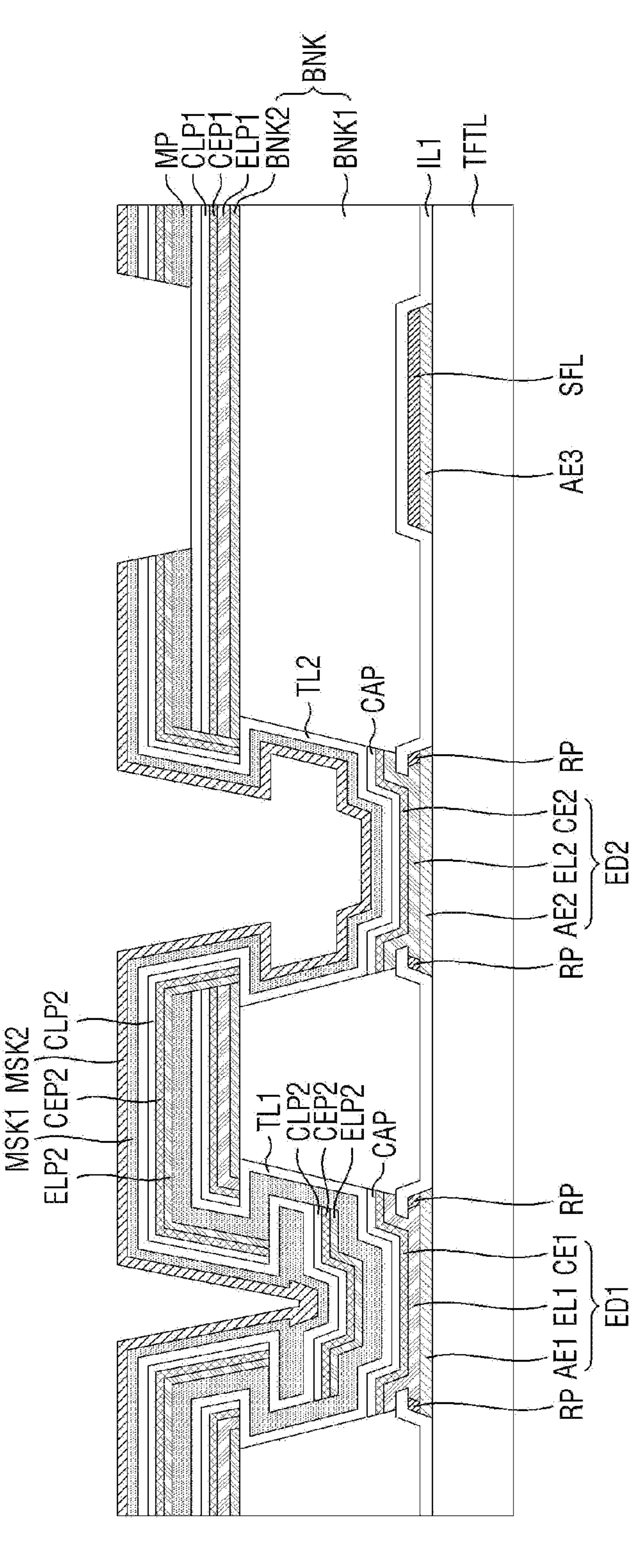

In FIG. 22, the third metal mask MSK3 and the metal pattern MP may include the same metal material. Therefore, the third metal mask MSK3 disposed on the entire surface of the display device 10 and the metal pattern MP overlapping the third pixel electrode AE3 may be etched together with each other in the same process, and the second metal mask MSK2 disposed under the third metal mask MSK3 and the first inorganic layer TL1 disposed under the metal pattern MP may remain to be exposed.

Figure 23:
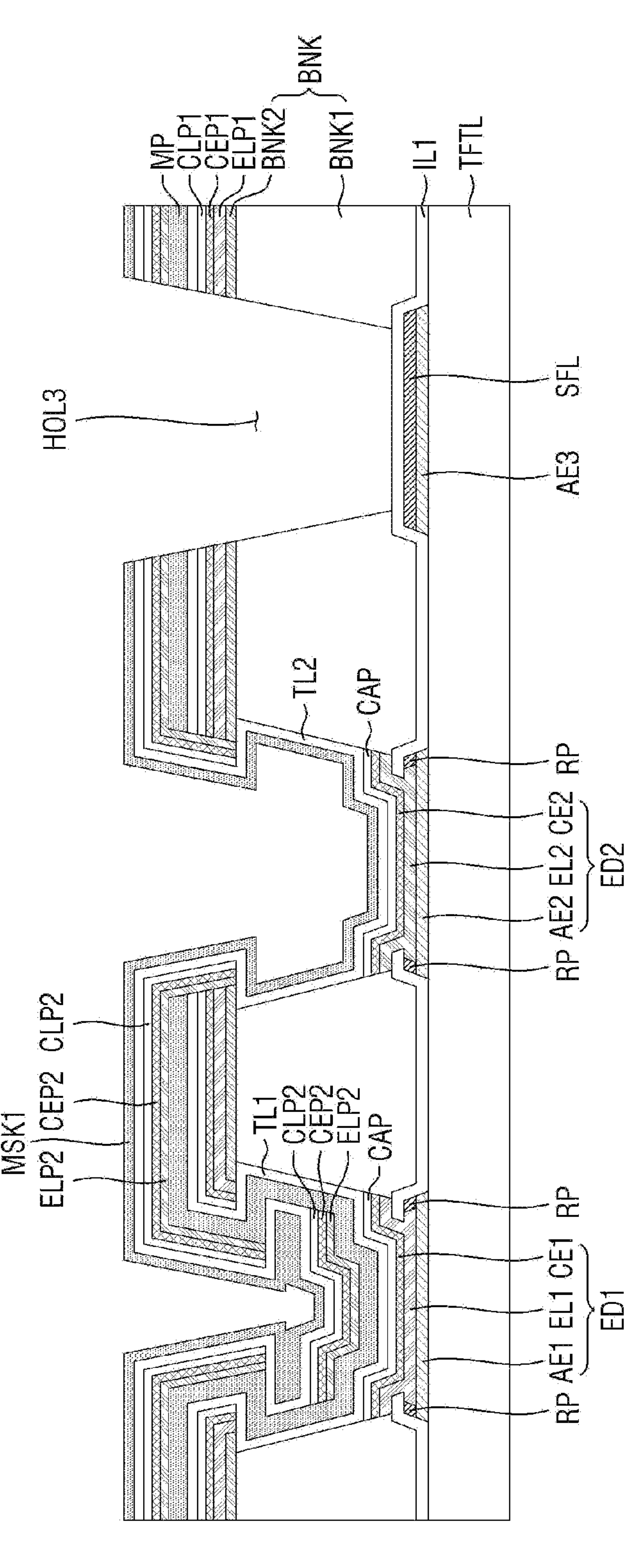

In FIG. 23, the first inorganic layer TL1, the first capping pattern CLP1, the first electrode pattern CEP1, the first organic pattern ELP1, the second bank BNK2, the first bank BNK1, the first insulating layer IL1, and the sacrificial layer SFL may be sequentially etched to form the third hole HOL3.

The first inorganic layer TL1, the first capping pattern CLP1, the first electrode pattern CEP1, the first organic pattern ELP1, the second bank BNK2, and the first bank BNK1 may be etched using the second metal mask MSK2 as a hard mask. An etched area of the first bank BNK1 may be smaller than that of the second bank BNK2. The second metal mask MSK2 may be removed in the etching process of the bank BNK. The first inorganic layer TL1, the first capping pattern CLP1, the first electrode pattern CEP1, the first organic pattern ELP1, the second bank BNK2, and the first bank BNK1 may be etched by performing at least one of a dry etching process and a wet etching process.

Figure 24:
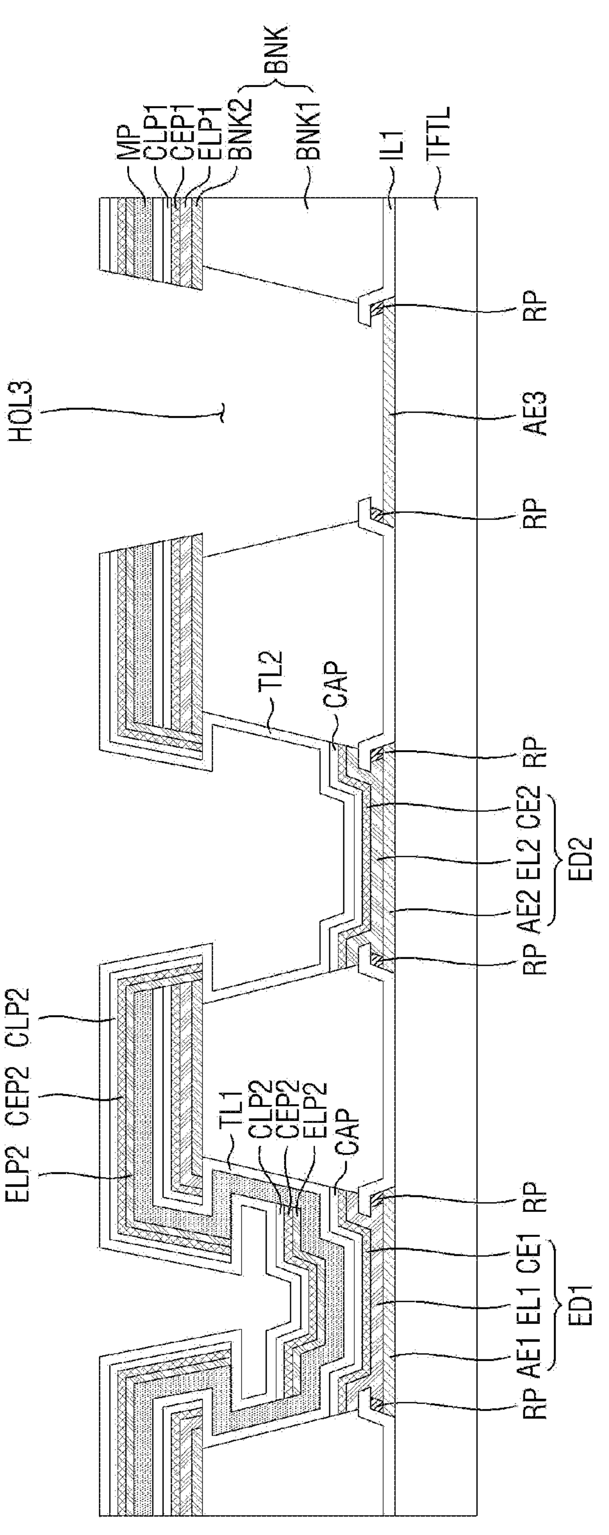

In FIG. 24, the side surfaces of the first bank BNK1, the first insulating layer IL1, and the sacrificial layer SFL may be etched using the first metal mask MSK1 as a hard mask. A portion of the first metal mask MSK1 may be removed in the etching process of the side surfaces of the first bank BNK1. The side surfaces of the first bank BNK1 may be recessed inward from the side surfaces of the second bank BNK2. Therefore, the second bank BNK2 may include tips protruding from the first bank BNK1 toward the third emission area EA3, and an undercut structure may be formed under the tips of the second bank BNK2.

The rest of the first metal mask MSK1 may be completely removed in the etching process of the first insulating layer IL1 and the sacrificial layer SFL as a third sacrificial pattern. As the first insulating layer IL1 and the sacrificial layer SFL are etched, at least a portion of the upper surface of the third pixel electrode AE3 may be exposed. The sacrificial layer SFL may be etched more than the first insulating layer IL1 in the plan view. When the sacrificial layer SFL is etched, a residual pattern RP as a third residual pattern may remain between the first insulating layer IL1 and the third pixel electrode AE3.

Figure 25:
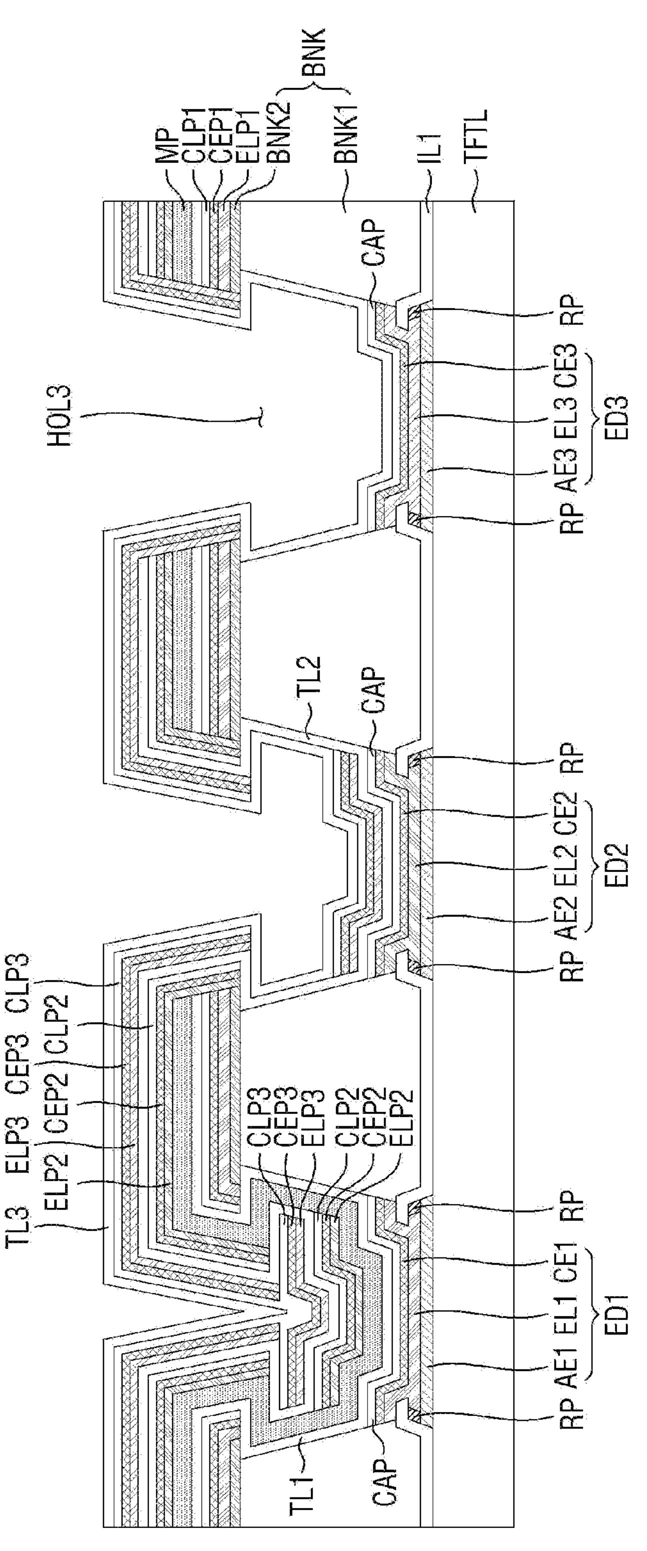

In FIG. 25, a third light emitting layer EL3 may be directly disposed on the third pixel electrode AE3 in the third emission area EA3. A portion of the third light emitting layer EL3 may fill a space surrounded by the third pixel electrode AE3, the residual pattern RP and the first insulating layer IL1, and the other portion of the third light emitting layer EL may cover a portion of the upper surface of the first insulating layer IL1.

An organic material for forming the third light emitting layer EL3 and a third organic pattern ELP3 may be deposited on the entire surface of the display device 10. The third organic pattern ELP3 may include the same organic material as the third light emitting layer EL3 and may be disposed on the second inorganic layer TL2. The third organic pattern ELP3 may cover the side surfaces of the second bank BNK2, the first organic pattern ELP1, the first electrode pattern CEP1, the first capping pattern CLP1, the first inorganic layer TL1, the metal pattern MP, the second organic pattern ELP2, the second electrode pattern CEP2, the second capping pattern CLP2, and the second inorganic layer TL2 which are adjacent to the third emission area EA3. The third light emitting layer EL3 and the third organic pattern ELP3 may be deposited in the same process, but may be cut by the tips formed on the inner walls of the bank BNK. Therefore, the third organic pattern ELP3 may be disposed on the second inorganic layer TL2 in areas other than the third emission area EA3.

A third common electrode CE3 may be disposed on the third light emitting layer EL3. The third common electrode CE3 may include a transparent conductive material and transmit light generated from the third light emitting layer EL3. The third common electrode CE3 may contact the side surfaces of the bank BNK. Therefore, a third light emitting element ED3 may be formed in the third hole HOL3 and may emit light through the third emission area EA3.

A metal material for forming the third common electrode CE3 and a third electrode pattern CEP3 may be deposited on the entire surface of the display device 10. The third electrode pattern CEP3 may include the same metal material as the third common electrode CE3 and may be disposed on the third organic pattern ELP3. The third electrode pattern CEP3 may cover side surfaces of the third organic pattern ELP3 adjacent to the third emission area EA3. The third common electrode CE3 and the third electrode pattern CEP3 may be deposited in the same process, but may be cut by the tips formed on the inner walls of the bank BNK. Therefore, the third electrode pattern CEP3 may be disposed on the third organic pattern ELP3 in the areas other than the third emission area EA3.

A third lower capping pattern of the capping layer CAP may be disposed on the third common electrode CE3. The capping layer CAP may include an inorganic insulating material and may cover the third light emitting element ED3. The capping layer CAP may prevent the third light emitting element ED3 from being damaged by external air.

An inorganic material for forming the capping layer CAP and a third capping pattern CLP3 may be deposited on the entire surface of the display device 10. The third capping pattern CLP3 may include the same inorganic material as the capping layer CAP and may be disposed on the third electrode pattern CEP3. The third capping pattern CLP3 may cover side surfaces of the third electrode pattern CEP3 adjacent to the third emission area EA3. The capping layer CAP and the third capping pattern CLP3 may be deposited in the same process, but may be cut by the tips formed on the inner walls of the bank BNK. Therefore, the third capping pattern CLP3 may be disposed on the third electrode pattern CEP3 in the areas other than the third emission area EA3.

A third inorganic layer TL3 may be disposed on the capping layer CAP of the third emission area EA3 and the third capping pattern CLP3. The third inorganic layer TL3 may cover the side surfaces of the second bank BNK2 surrounding the third emission area EA3. The third inorganic layer TL3 may include an inorganic material to prevent oxygen or moisture from penetrating into the third light emitting element ED3. The third inorganic layer TL3 may be an inorganic encapsulation layer. For example, the third inorganic layer TL3 may be made of any of the materials exemplified in the description of the first inorganic layer TL1.

Figure 26:
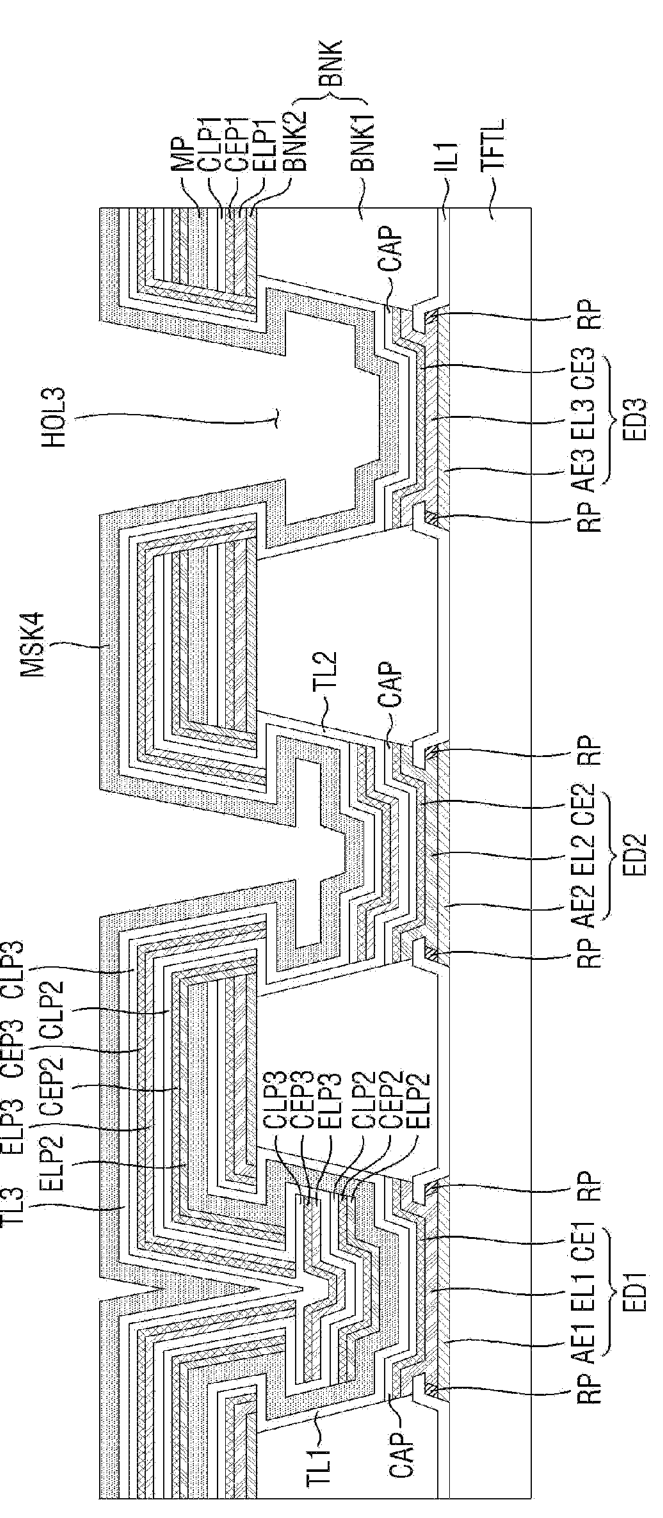

In FIG. 26, a fourth metal mask MSK4 may be disposed on the third inorganic layer TL3. A metal material for forming the fourth metal mask MSK4 may be deposited on the entire surface of the display device 10. The fourth metal mask MSK4 may include at least one of indium tin oxide (ITO), indium zinc oxide (IZO), indium tin zinc oxide (ITZO), silver (Ag), copper (Cu), aluminum (Al), molybdenum (Mo), titanium (Ti), nickel (Ni), and lanthanum (La).

Figure 27:
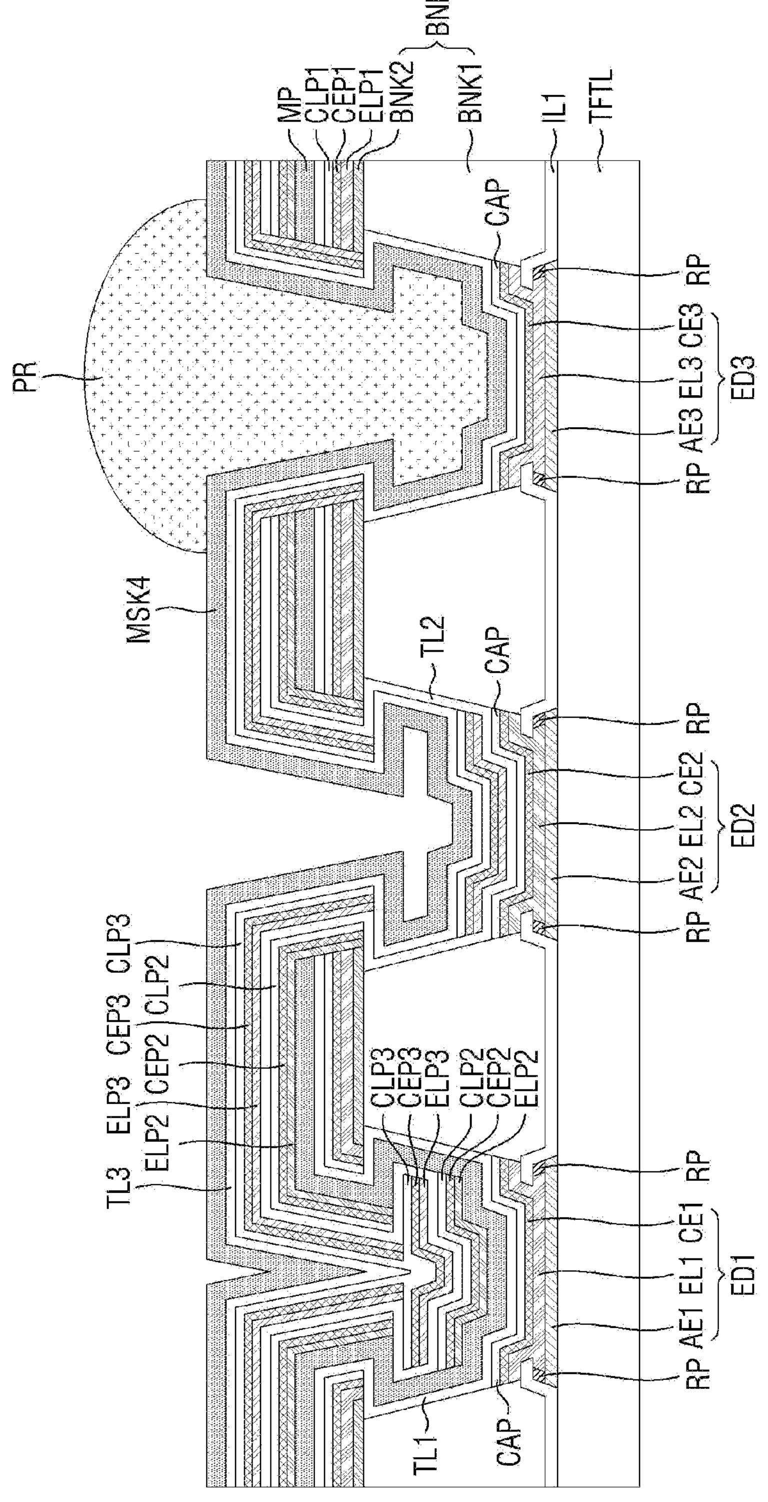

In FIG. 27, a photoresist PR as a fourth photoresist may be disposed on the fourth metal mask MSK4 to overlap the third light emitting element ED3. The photoresist PR may overlap the third emission area EA3.

Figure 28:
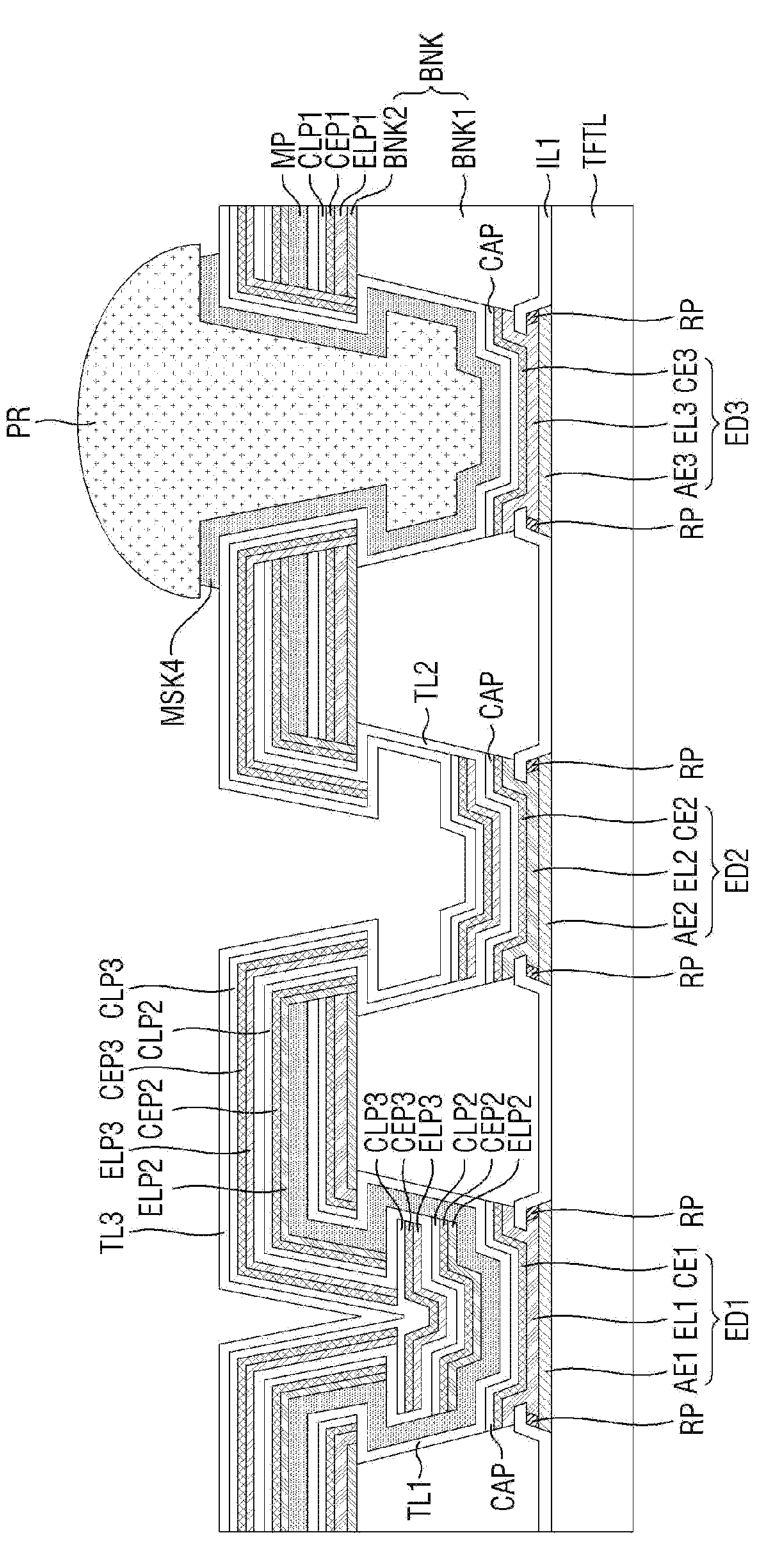

In FIG. 28, the fourth metal mask MSK4 may be etched using the photoresist PR as a mask. The fourth metal mask MSK4 may be etched by performing a wet etching process. Side surfaces of the fourth metal mask MSK4 may be recessed inward from side surfaces of the photoresist PR. The fourth metal mask MSK4 may be etched in the first emission area EA1, an area adjacent to the first emission area EA1, the second emission area EA2, and an area adjacent to the second emission area EA2. Accordingly, the fourth metal mask MSK4 may remain in an area overlapping the third emission area EA3.

Figure 29:
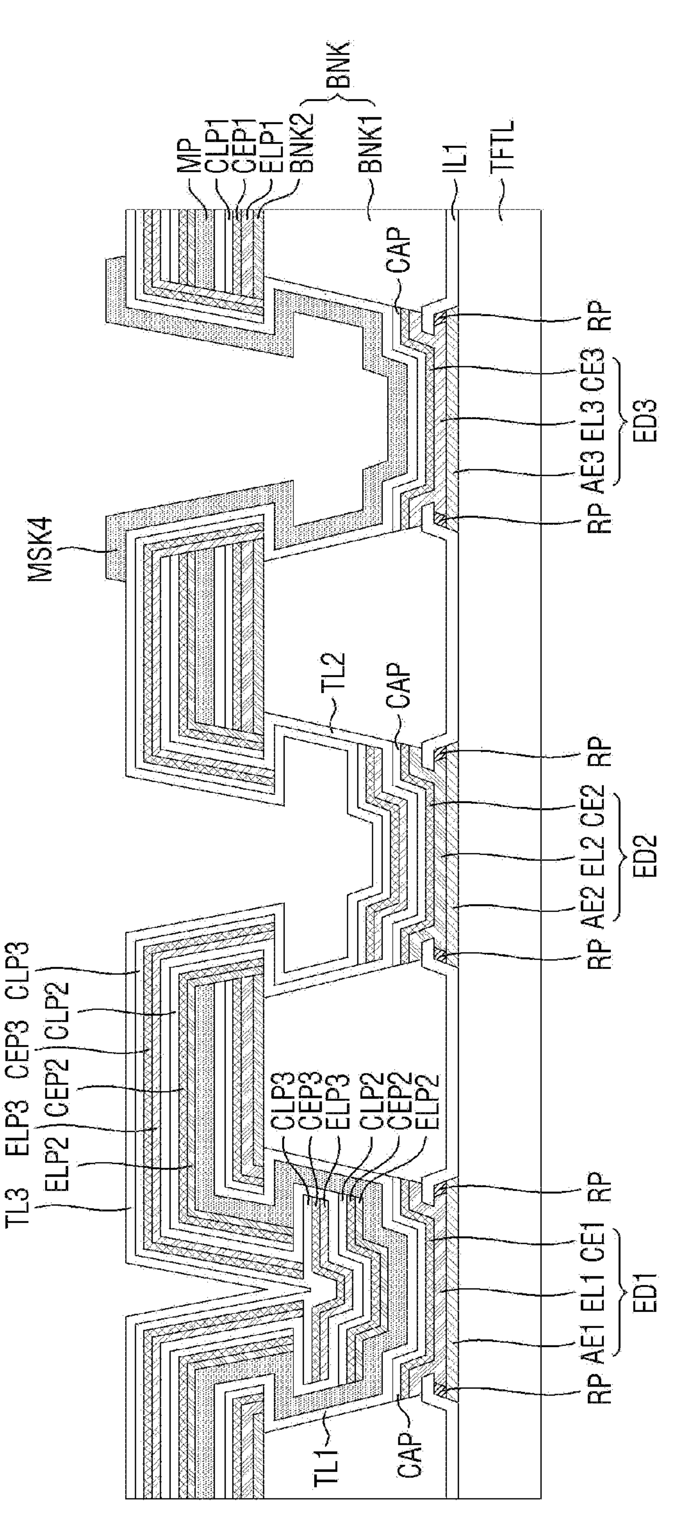

In FIG. 29, the photoresist PR may be removed through a strip process after the fourth metal mask MSK4 is etched. The third organic pattern ELP3 and various other organic patterns may not be exposed in the strip process of the photoresist PR.

Figure 30:
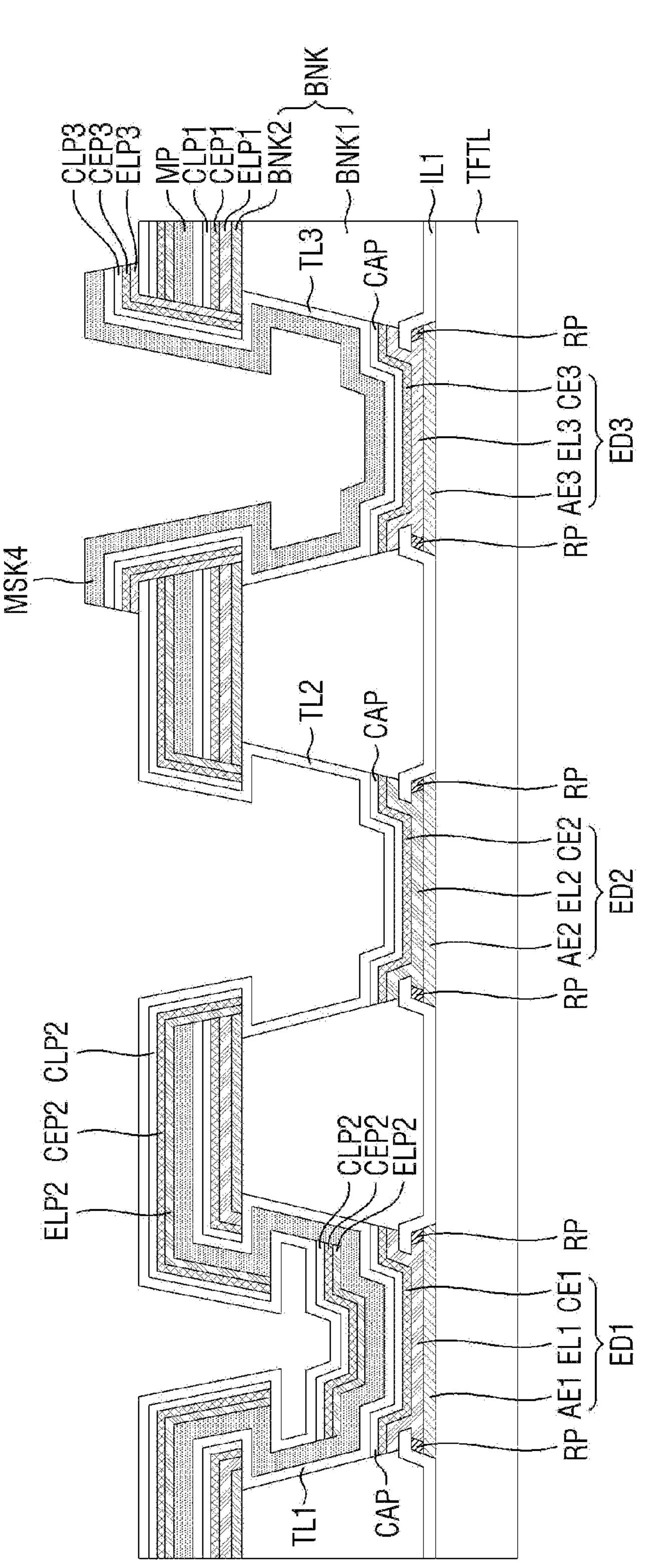

In FIG. 30, the third inorganic layer TL3, the third capping pattern CLP3, the third electrode pattern CEP3, and the third organic pattern ELP3 of a preliminary third stacked structure may be sequentially etched to expose portions of the second stacked structure. For example, the fourth metal mask MSK4 may include indium zinc oxide (IZO) to serve as a hard mask in the process of patterning the third organic pattern ELP3.

Therefore, since the third organic pattern ELP3 is patterned using the fourth metal mask MSK4 in the display device 10, the exposure of the third organic pattern ELP3 in the strip photoresist process can be avoided, and the peeling of the third electrode pattern CEP3, the third capping pattern CLP3 and the third inorganic layer TL3 on the third organic pattern ELP3 can be prevented.

The third inorganic layer TL3, the third capping pattern CLP3, the third electrode pattern CEP3, and the third organic pattern ELP3 may be etched by performing at least one of a dry etching process and a wet etching process. Therefore, the third inorganic layer TL3, the third capping pattern CLP3, the third electrode pattern CEP3, and the third organic pattern ELP3 may be etched in the first emission area EA1, the area adjacent to the first emission area EA1, the second emission area EA2 and the area adjacent to the second emission area EA2 and may remain in an area adjacent to the third emission area EA3.

Figure 31:
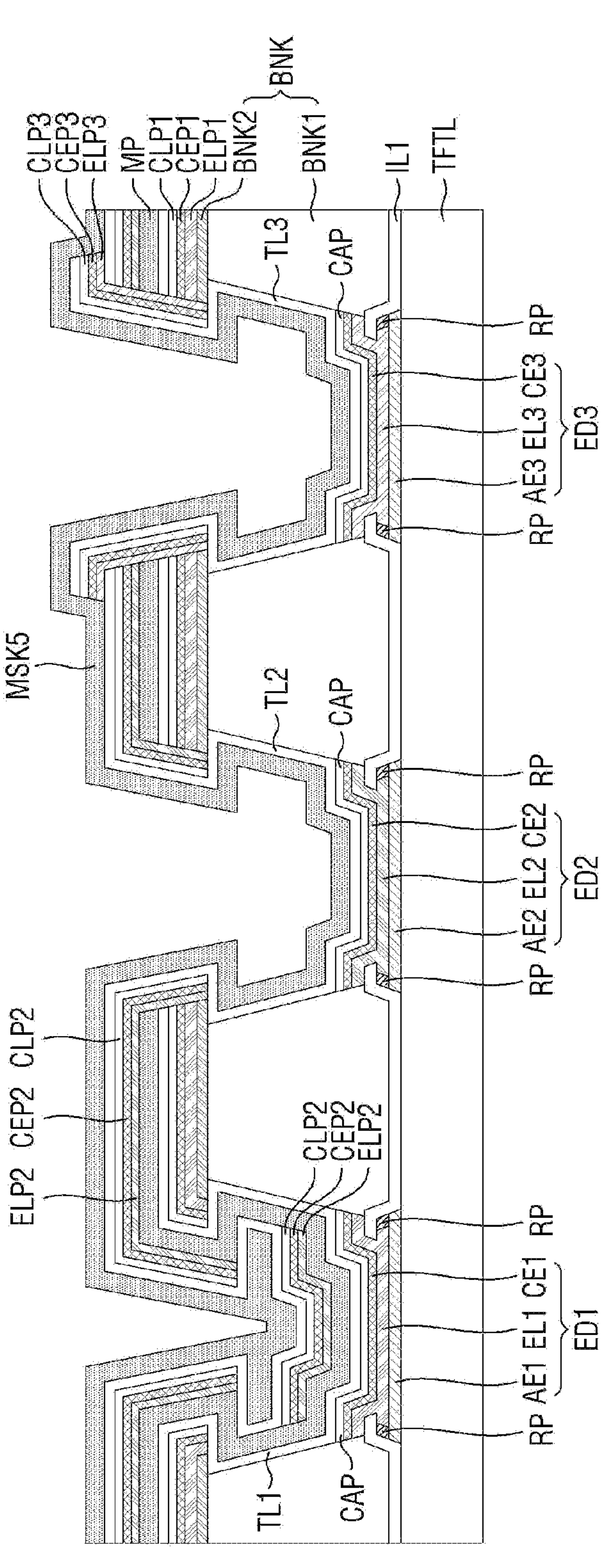

In FIG. 31, a fifth metal mask MSK5 may be disposed on the second inorganic layer TL2 and the fourth metal mask MSK4 which is adjacent to the second inorganic layer TL2. A metal material for forming the fifth metal mask MSK5 may be deposited on the entire surface of the display device 10. The fifth metal mask MSK5 may include at least one of indium tin oxide (ITO), indium zinc oxide (IZO), indium tin zinc oxide (ITZO), silver (Ag), copper (Cu), aluminum (Al), molybdenum (Mo), titanium (Ti), nickel (Ni), and lanthanum (La). The fifth metal mask MSK5 may include the same metal material as the fourth metal mask MSK4, such that FIG. 31 shows a label for the fifth metal mask MSK5 for convenience of illustration.

Figure 32:
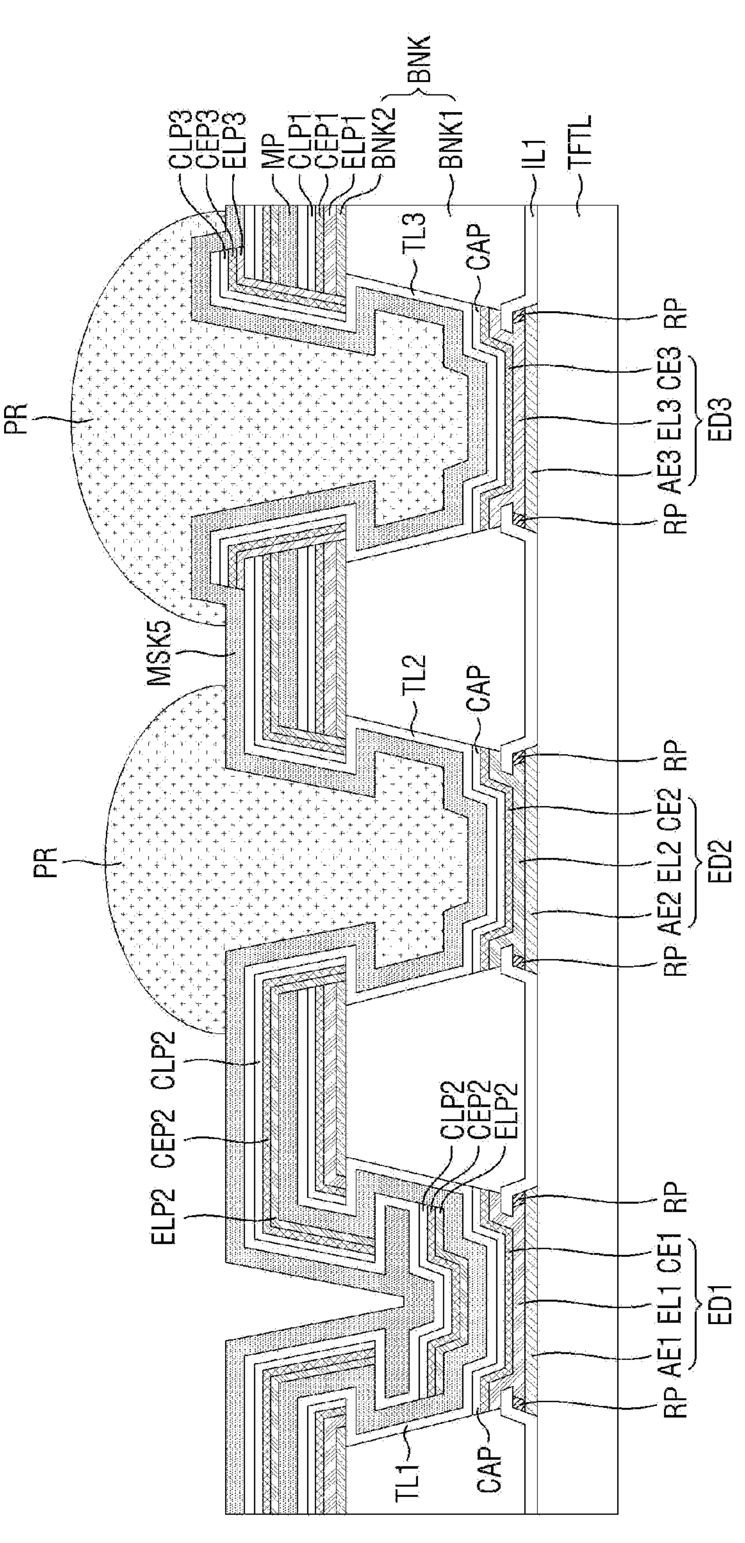

In FIG. 32, a plurality of photoresists PR as a fifth photoresist pattern may be disposed on the fifth metal mask MSK5 to overlap the second and third light emitting elements ED2 and ED3. The photoresists PR may overlap the second and third emission areas EA2 and EA3.

Figure 33:
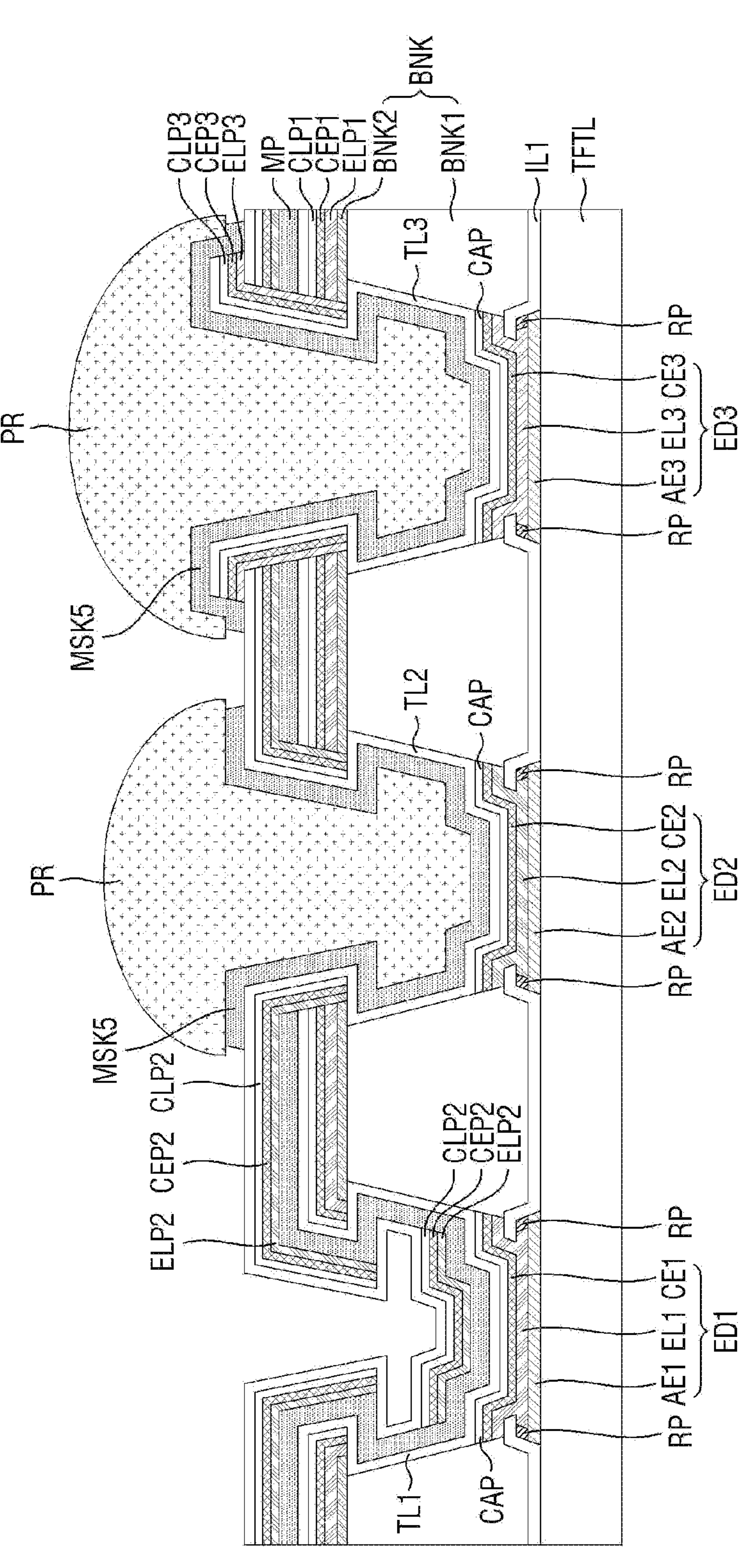

In FIG. 33, the fifth metal mask MSK5 may be etched using the photoresists PR as masks. The fifth metal mask MSK5 may be etched by performing a wet etching process. Side surfaces of the plurality of fifth metal masks MSK5 may be recessed inward from side surfaces of the photoresists PR. The plurality of fifth metal masks MSK5 may be etched in the first emission area EA1 and the area adjacent to the first emission area EA1. Accordingly, the plurality of fifth metal masks MSK5 may remain in the areas overlapping the second and third emission areas EA2 and EA3. The fifth metal mask MSK5 may cover the side surfaces of the third organic pattern ELP3, the third electrode pattern CEP3, the third capping pattern CLP3, and the third inorganic layer TL3 in the area adjacent to the third emission area EA3.

Figure 34:
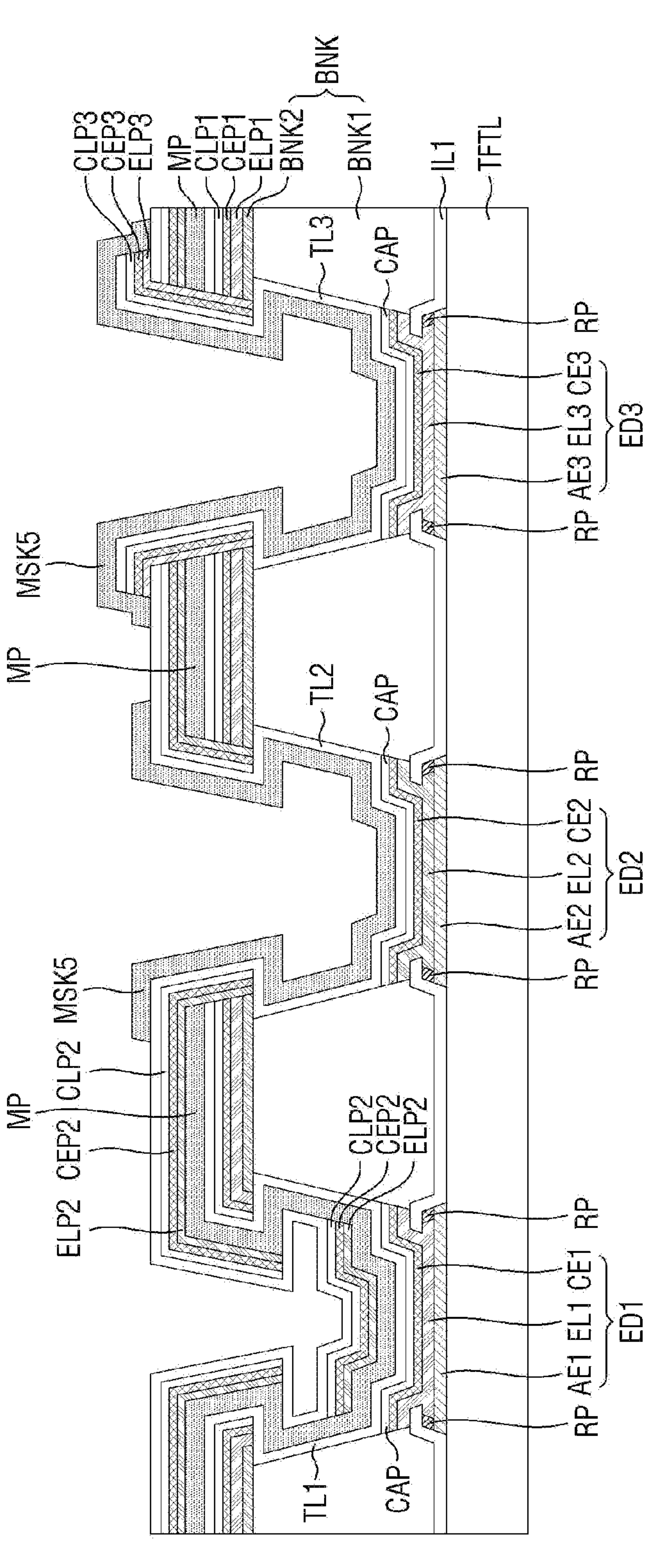

In FIG. 34, the photoresists PR may be removed through a strip process after the fifth metal mask MSK5 is etched. The second and third organic patterns ELP2 and ELP3 may not be exposed in the strip process of the photoresists PR.

Figure 35:
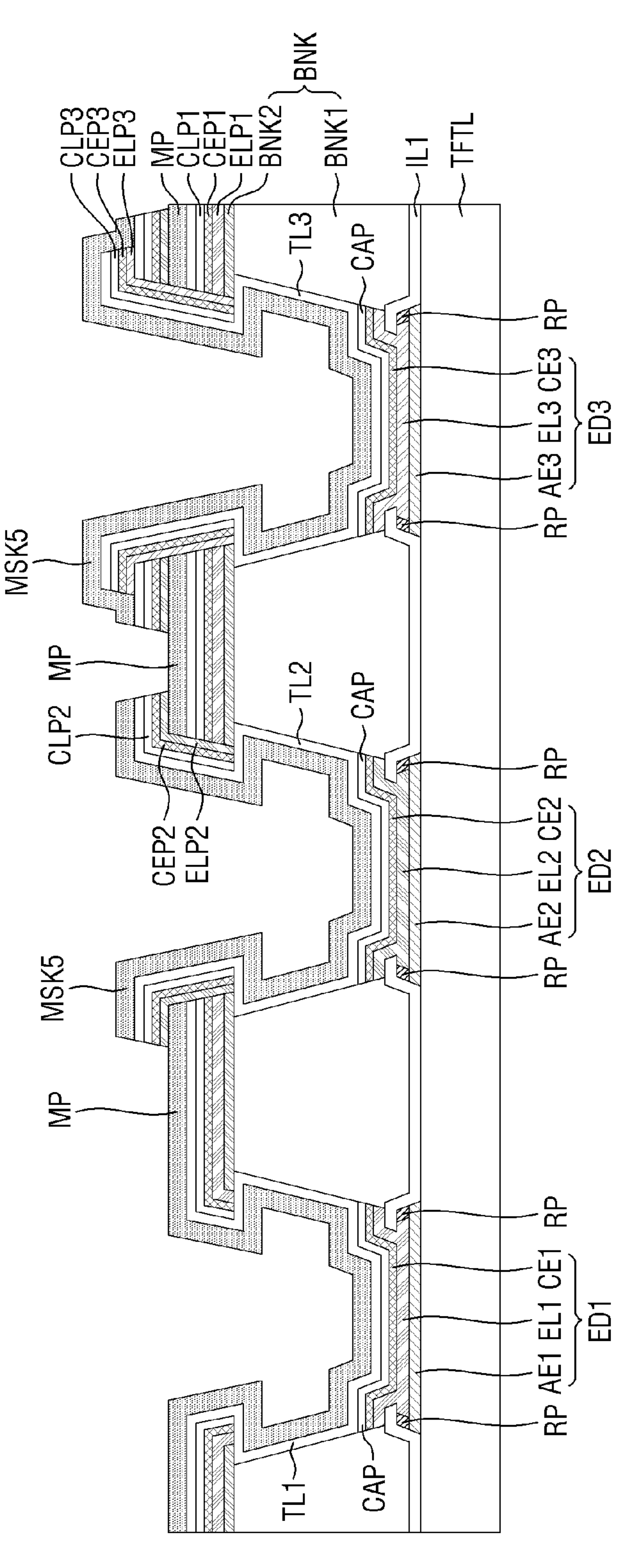

In FIG. 35, the second inorganic layer TL2, the second capping pattern CLP2, the second electrode pattern CEP2, and the second organic pattern ELP2 of the preliminary second stacked structure may be sequentially etched. For example, the fifth metal mask MSK5 may include indium zinc oxide (IZO) to serve as a hard mask in the process of patterning the second organic pattern ELP2.

Therefore, since the second organic pattern ELP2 is patterned using the fifth metal mask MSK5 in the display device 10, the exposure of the second organic pattern ELP2 in the photoresist strip process can be avoided, and the peeling of the second electrode pattern CEP2, the second capping pattern CLP2 and the second inorganic layer TL2 on the second organic pattern ELP2 can be prevented.

The second inorganic layer TL2, the second capping pattern CLP2, the second electrode pattern CEP2, and the second organic pattern ELP2 may be etched by performing at least one of a dry etching process and a wet etching process. Therefore, the second inorganic layer TL2, the second capping pattern CLP2, the second electrode pattern CEP2, and the second organic pattern ELP2 may be etched in the first emission area EA1 and the area adjacent to the first emission area EA1 and may remain in the areas adjacent to the second and third emission areas EA2 and EA3.

Figure 36:
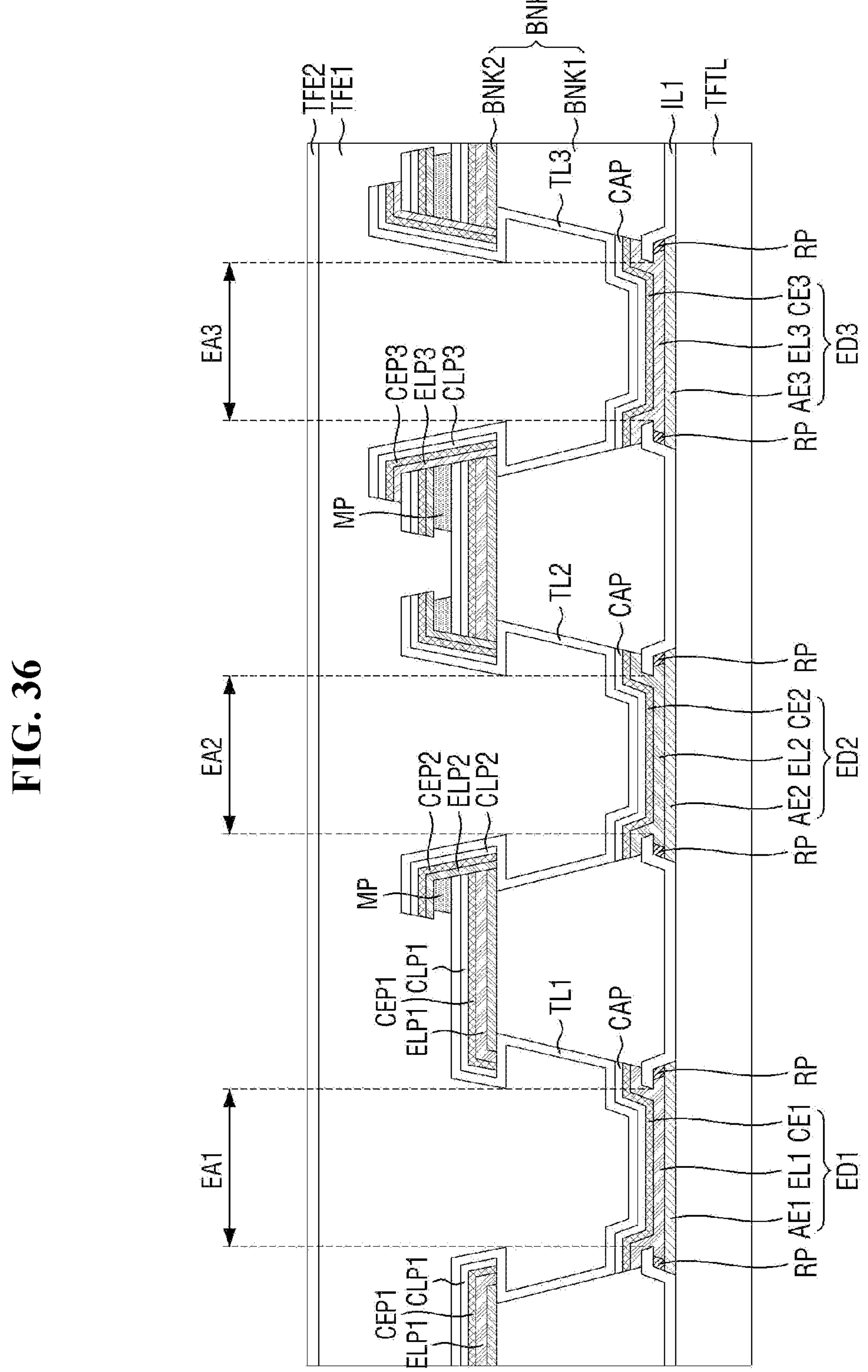

In FIG. 36, the fifth metal mask MSK5 and the metal pattern MP may be etched by performing at least one of a dry etching process and a wet etching process. For example, the fifth metal mask MSK5 disposed in the second and third emission areas EA2 and EA3 may be entirely etched through a wet etching process. The metal pattern MP may be etched through a wet etching process and may remain as a remaining metal pattern in an area surrounding each of the second and third emission areas EA2 and EA3. The metal pattern MP disposed under the second inorganic layer TL2, the second capping pattern CLP2, the second electrode pattern CEP2, and the second organic pattern ELP2 which are adjacent to the second and third emission areas EA2 and EA3 may not be etched. An etching rate of the metal pattern MP may be higher than that of the second organic pattern ELP2. Therefore, the side surfaces of the metal pattern MP may be recessed inward from the side surfaces of the second organic pattern ELP2.

A first encapsulation layer TFE1 may be disposed on the first through third inorganic layers TL1 through TL3 to planarize an upper end of a light emitting element layer EML. The first encapsulation layer TFE1 may include an organic material to protect the light emitting element layer EML from foreign substances such as dust.

A second encapsulation layer TFE2 may be disposed on the first encapsulation layer TFE1. The second encapsulation layer TFE2 may include an inorganic material to prevent oxygen or moisture from penetrating into the light emitting element layer EML.

In a display device 10 and a method of manufacturing (or providing) the same according to embodiments, separate light emitting elements are respectively formed in a plurality of emission areas by performing deposition and etching processes using a metal pattern or a metal mask. Therefore, it is possible to avoid exposure of an organic material in a photoresist strip process in the deposition and etching processes and prevent peeling of stacked layers at the organic material pattern within the stacked layers.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising:
- a first organic pattern layer and a second organic pattern layer, on a substrate;
- a first pixel electrode on the substrate in a first emission area;
- a first light emitting layer of the first organic pattern layer, on the first pixel electrode;
- a second pixel electrode in a second emission area;
- a second light emitting layer of the second organic pattern layer, on the second pixel electrode;
- a bank which defines the first emission area and the second emission area, the bank comprising:
  - a first bank layer surrounding the first emission area and the second emission area, the first bank layer including side surfaces which define the first emission area and the second emission area; and
  - a second bank layer which is on the first bank layer and extends further than the side surfaces of first bank layer in a direction toward the first emission area and the second emission area, to define tips of the second bank layer which protrude further than the side surfaces of the first bank layer;

a first organic pattern of the first organic pattern layer, on the second bank layer;

a first inorganic layer on the first light emitting layer and the first organic pattern of the first organic pattern layer;

a metal pattern which is on the first inorganic layer and surrounds the second emission area; and a second organic pattern of the second organic pattern layer, on the metal pattern and surrounding the second emission area, wherein each of the metal pattern and the second organic pattern includes first side surfaces which are furthest from the second emission area, and the first side surfaces of the metal pattern form an undercut structure with the first side surfaces of the second organic pattern.

2. The display device of claim 1, wherein the metal pattern includes at least one of indium tin oxide, indium zinc oxide, indium tin zinc oxide, indium gallium zinc oxide, indium gallium oxide, indium tin gallium oxide, and indium tin gallium zinc oxide.

3. The display device of claim 1, wherein each of the second bank layer, the first organic pattern, the first inorganic layer and the metal pattern includes second side surfaces closest to the second emission area, and the second organic pattern covers the second side surfaces of the second bank layer, the second side surfaces of the first organic pattern, the second side surfaces of the first inorganic layer, and the second side surfaces of the metal pattern.

4. The display device of claim 1, further comprising:

a first common electrode between the first light emitting layer and the first inorganic layer; and a second common electrode on the second light emitting layer.

5. The display device of claim 4, wherein the first common electrode and the second common electrode contact the first bank layer at the side surfaces of the first bank layer, and the first common electrode and the second common electrode are electrically connected to each other through the first bank layer.

6. The display device of claim 1, further comprising a second inorganic layer on the second light emitting layer and the second organic pattern of the second organic pattern layer.

7. The display device of claim 6, further comprising:

a third pixel electrode on the substrate in a third emission area;

a third light emitting layer on the third pixel electrode; and a third common electrode on the third light emitting layer.

8. The display device of claim 7, wherein the metal pattern which is on the first inorganic layer further surrounds the third emission area, and the second organic pattern which is on the metal pattern further surrounds the third emission area.

9. The display device of claim 7, further comprising:

a third organic pattern layer on the substrate, the third organic pattern layer including:

the third light emitting layer, and a third organic pattern on the second inorganic layer; and a third inorganic layer on the third light emitting layer and the third organic pattern of the third organic pattern layer.

10. The display device of claim 9, wherein each of the second bank layer, the first organic pattern, the first inorganic layer, the metal pattern, the second organic pattern and the second inorganic layer includes third side surfaces closest to the third emission area, and the third organic pattern covers the third side surfaces of the second bank layer, the third side surfaces of the first organic pattern, the third side surfaces of the first inorganic layer, the third side surfaces of the metal pattern, the third side surfaces of the second organic pattern, and third side surfaces of the second inorganic layer.

11. A method of providing a display device, the method comprising:

providing a first pixel electrode, a second pixel electrode and a third pixel electrode on a substrate;

providing a sacrificial layer, an insulating layer, a first bank layer and a second bank layer, in order on the first through third pixel electrodes;

etching respective portions of the second bank layer, the first bank layer, the insulating layer and the sacrificial layer which correspond to the first pixel electrode, to expose the first pixel electrode to outside the sacrificial layer, the insulating layer, the first bank layer and the second bank layer;

providing a first organic pattern layer on the substrate, the first organic pattern layer including a first light emitting layer on the first pixel electrode which is exposed, and a first organic pattern on the second bank layer;

providing a first inorganic layer on the first light emitting layer and the first organic pattern of the first organic pattern layer;

providing a metal layer on the first inorganic layer and removing the metal layer at an area of the metal layer which overlaps the second pixel electrode to provide a metal pattern; and exposing the second pixel electrode by etching portions of the second bank layer, the first bank layer, the insulating layer and the sacrificial layer which correspond to the second pixel electrode, using the metal pattern as a mask.

12. The method of claim 11, wherein the metal pattern includes at least one of indium tin oxide, indium zinc oxide, indium tin zinc oxide, indium gallium zinc oxide, indium gallium oxide, indium tin gallium oxide, and indium tin gallium zinc oxide.

13. The method of claim 11, wherein the exposing of the first pixel electrode comprises providing side surfaces of the second bank layer which protrude further than side surfaces of the first bank layer, to define protruding tips of the second bank layer, by the etching of the respective portion of the first bank layer more than the etching of the respective portion of the second bank layer.

14. The method of claim 13, wherein the providing of the first organic pattern layer including the first light emitting layer and the first organic pattern comprises:

providing an organic material the substrate, and the protruding tips of the second bank layer disconnecting the organic material to provide the first light emitting layer disconnected from the first organic pattern.

15. The method of claim 11, further comprising:

providing a second organic pattern layer on the substrate, the second organic pattern layer including a second light emitting layer on the second pixel electrode, and a second organic pattern on the metal pattern;

providing a second inorganic layer on the second light emitting layer and the second organic pattern of the second organic pattern layer; and providing a first metal mask layer, a second metal mask layer and a third metal mask layer, in order on the second inorganic layer and patterning the first through third metal mask layers at portions of the first through third metal mask layers which correspond to the third pixel electrode, to provide a first metal mask, a second metal mask and a third metal mask.

16. The method of claim 15, further comprising:

etching the second inorganic layer and the second organic pattern using the third metal mask as a mask, to provide the metal pattern exposed at an area corresponding to the third pixel electrode; and etching the third metal mask to remove the third metal mask from the second inorganic layer, wherein the metal pattern includes the same metal material as the third metal mask, and the etching of the third metal mask further removes the metal pattern at the area corresponding to the third pixel electrode.

17. The method of claim 16, further comprising:

etching respective portions of the first inorganic layer, the first organic pattern, the second bank layer and the first bank layer which correspond to the third pixel electrode, using the second metal mask as a mask, to expose a portion of the insulating layer which corresponds to the third pixel electrode together with removing the second metal mask from the second inorganic layer; and etching the portion of the insulating layer which is exposed and a respective portion of the sacrificial layer which corresponds to the third pixel electrode, using the first metal mask as a mask, wherein the etching of the portion of the insulating layer and the respective portion of the sacrificial layer removes the first metal mask from the second inorganic layer.

18. The method of claim 17, further comprising:

providing a third organic pattern layer on the substrate, the third organic pattern layer including a third light emitting layer on the third pixel electrode, and a third organic pattern on the second inorganic layer;

providing a third inorganic layer on the third light emitting layer and the third organic pattern of the third organic pattern layer;

providing a fourth metal mask on the third inorganic layer to overlap the third pixel electrode; and etching the third inorganic layer and the third organic pattern using the fourth metal mask as a mask, to provide the second inorganic layer exposed at areas except for the an area of the third pixel electrode.

19. The method of claim 18, further comprising:

providing a plurality of fifth metal masks respectively on the fourth metal mask to overlap the third pixel electrode and on the second inorganic layer to overlap the second pixel electrode, the plurality of fifth metal masks exposing portions of both the second inorganic layer and the second organic pattern which are between the first pixel electrode and the second pixel electrode and between the second pixel electrode and the third pixel electrode; and etching the portions of the second inorganic layer and the second organic pattern which are between the first pixel electrode and the second pixel electrode and between the second pixel electrode and the third pixel electrode, using the plurality of fifth metal masks as masks, to expose portions of the metal pattern which are between the first pixel electrode and the second pixel electrode and between the second pixel electrode and the third pixel electrode to outside the plurality of fifth metal masks.

20. The method of claim 19, further comprising etching the plurality of fifth metal masks and the portions of the metal pattern, to provide a remaining metal pattern at an area of the first inorganic layer which surrounds each of the second pixel electrode and the third pixel electrode.

* * * * *